(12) United States Patent
Damaraju et al.

(10) Patent No.: US 12,543,594 B2
(45) Date of Patent: Feb. 3, 2026

(54) SCALABLE PACKAGE ARCHITECTURE USING RETICLE STITCHING AND PHOTONICS FOR INTEGRATED CIRCUITS

(71) Applicant: Intel Corporation, Santa Clara, CA (US)

(72) Inventors: Satish Damaraju, El Dorado Hills, CA (US); Scott E. Siers, Elk Grove, CA (US); Altug Kokar, El Dorado Hills, CA (US); Wilfred Gomes, Portland, OR (US); Mark C. Davis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 769 days.

(21) Appl. No.: 17/733,880

(22) Filed: Apr. 29, 2022

(65) Prior Publication Data
US 2023/0352464 A1    Nov. 2, 2023

(51) Int. Cl.
*H01L 25/16*    (2023.01)
*H01L 23/00*    (2006.01)
*H01L 23/538*    (2006.01)

(52) U.S. Cl.
CPC ........ *H01L 25/167* (2013.01); *H01L 23/5386* (2013.01); *H01L 24/08* (2013.01); *H01L 24/80* (2013.01); *H01L 24/16* (2013.01); *H01L 2224/08147* (2013.01); *H01L 2224/16227* (2013.01); *H01L 2224/16238* (2013.01); *H01L 2224/80895* (2013.01); *H01L 2224/80896* (2013.01); *H01L 2924/1431* (2013.01); *H01L 2924/1436* (2013.01)

(58) Field of Classification Search
CPC .......... H01L 25/167; H01L 2924/1436; H01L 2924/1431; H01L 23/5386; H01L 24/08; H01L 2224/08147; H01L 24/16; H01L 2224/16227; H01L 2224/16238; H01L 2224/80896; H01L 2224/80895
USPC ........................................................ 257/690
See application file for complete search history.

(56) References Cited

U.S. PATENT DOCUMENTS

| | | |
|---|---|---|
| 8,546,955 B1 | 10/2013 | Wu |
| 9,432,298 B1 | 8/2016 | Smith |
| 2007/0108638 A1 | 5/2007 | Lane et al. |
| 2019/0096875 A1* | 3/2019 | Roh ................... H10D 89/921 |
| 2020/0006232 A1* | 1/2020 | Pietambaram ........ H01L 21/565 |
| 2020/0111734 A1* | 4/2020 | Lin ..................... H01L 25/0657 |
| 2021/0335712 A1* | 10/2021 | Jain ....................... H01L 23/147 |
| 2022/0077007 A1* | 3/2022 | Kim ......................... H01L 25/18 |

* cited by examiner

*Primary Examiner* — Didarul A Mazumder
(74) *Attorney, Agent, or Firm* — Akona IP PC

(57) ABSTRACT

Embodiments of a microelectronic assembly comprise a first integrated circuit (IC) die including a plurality of first circuits separated by scribe regions, and a plurality of second IC dies coupled to the first IC die, each one of the second IC dies being coupled proximate and adjacent to a corresponding one of the first circuits and conductively coupled to the corresponding one of the first circuits. One or more of the second IC dies comprises a second circuit different from the first circuit, adjacent ones of the first circuits are coupled by a conductive pathway through the corresponding scribe regions, and the first IC die and the second IC die are coupled by interconnects having a pitch not more than 10 micrometers between adjacent interconnects.

20 Claims, 10 Drawing Sheets

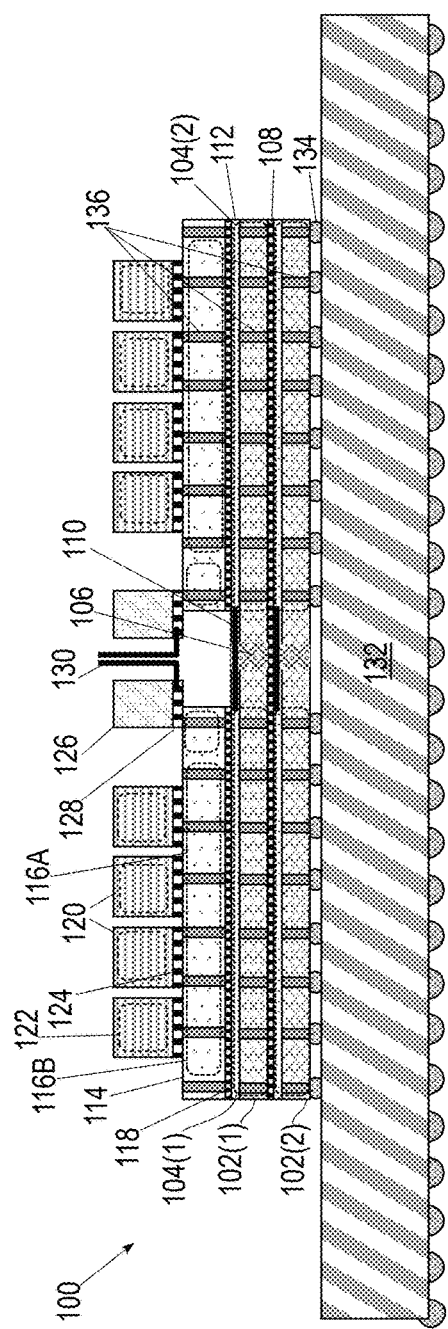
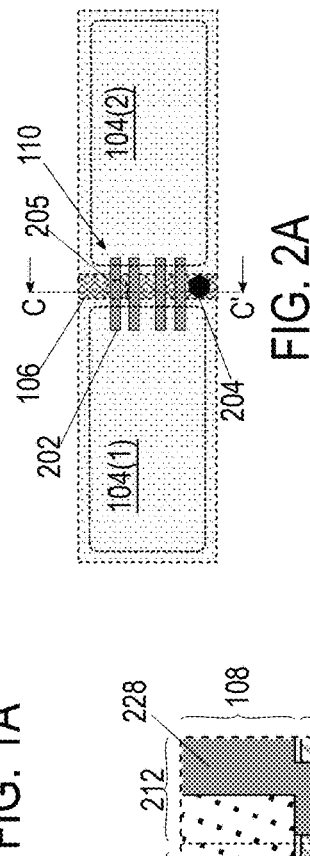
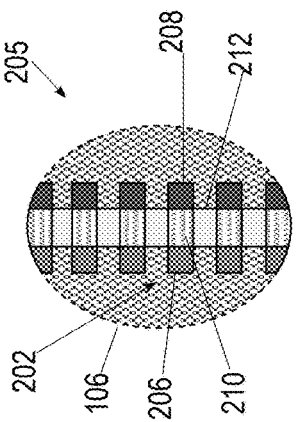
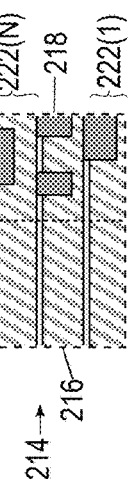
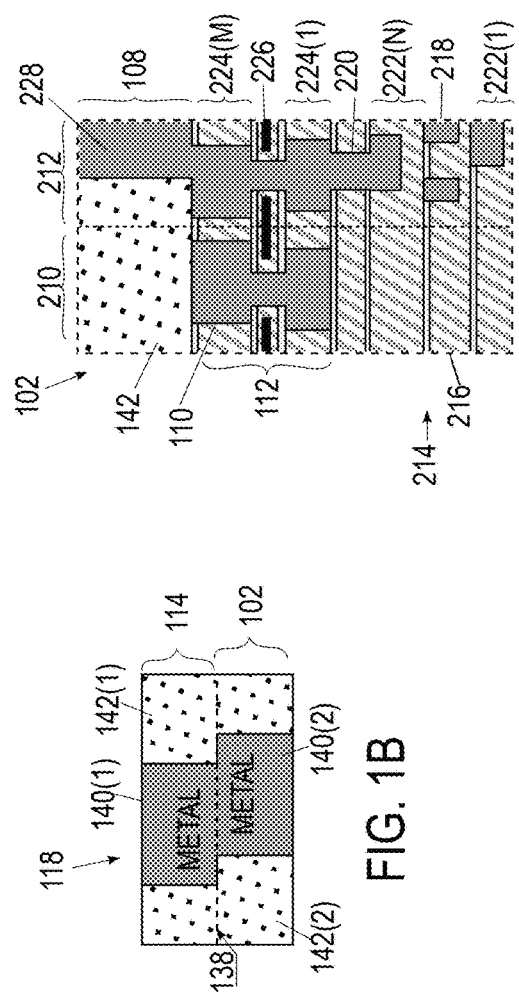
FIG. 1A
FIG. 1B
FIG. 2A
FIG. 2B
FIG. 2C

SCALABLE PACKAGE ARCHITECTURE USING RETICLE STITCHING AND PHOTONICS FOR INTEGRATED CIRCUITS

TECHNICAL FIELD

The present disclosure relates to techniques, methods, and apparatus directed to scalable package architecture using reticle stitching and photonics for integrated circuits.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1A is a schematic cross-sectional view of an example microelectronic assembly according to some embodiments of the present disclosure.

FIG. 1B is a schematic cross-sectional view of certain details in the example microelectronic assembly of FIG. 1A.

FIG. 2A is a schematic top view of a portion of the example microelectronic assembly of FIG. 1A.

FIG. 2B is a schematic top view of certain details in the portion of FIG. 2A.

FIG. 2C is a schematic cross-sectional view of certain details in the portion of FIG. 2A.

FIG. 7B is a schematic bottom view of a portion of the example microelectronic assembly of FIG. 7A.

DETAILED DESCRIPTION

Overview

Figure 3:
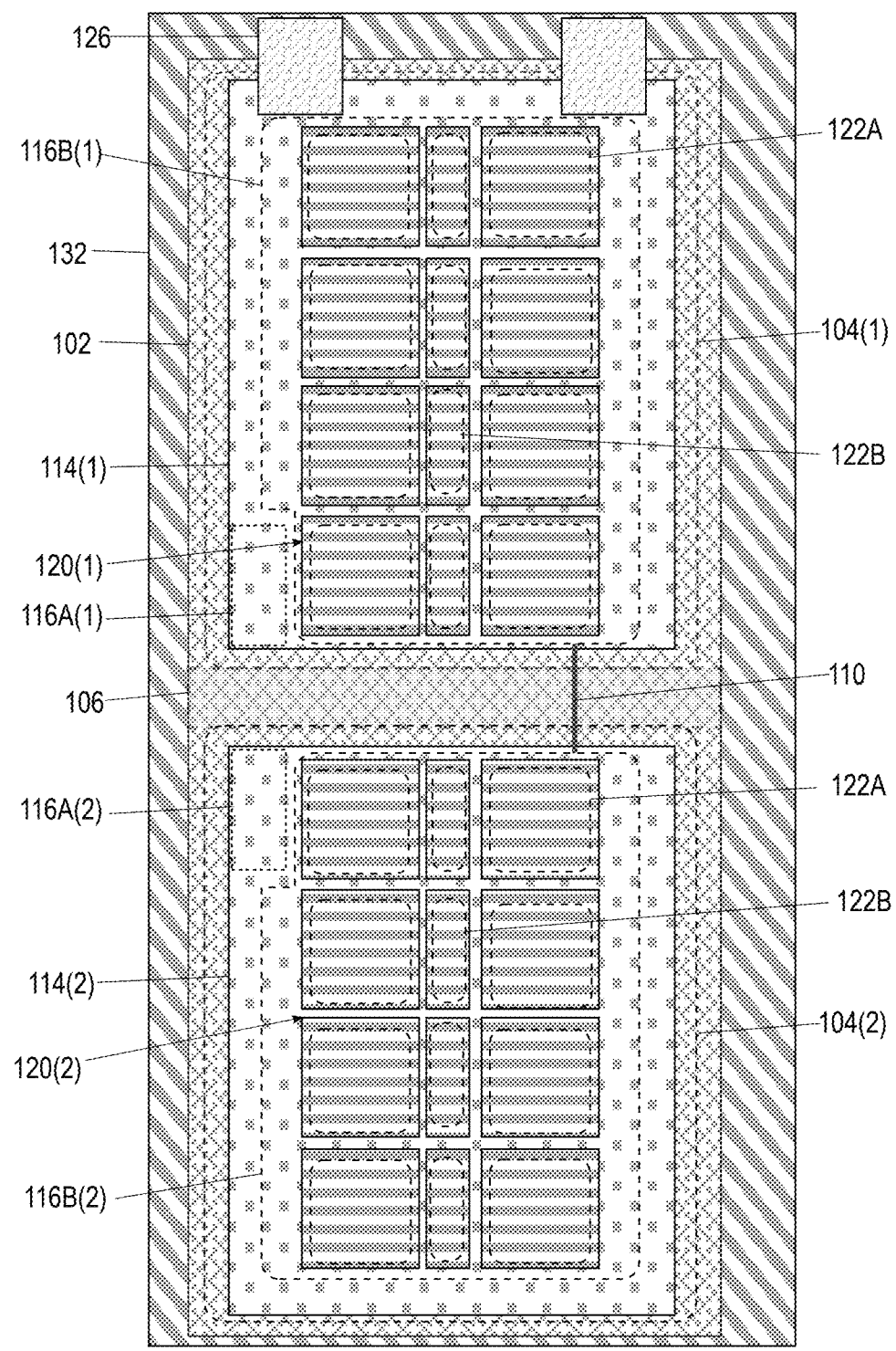
FIG. 3 is a schematic top view of another example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

One of the ways of connecting multiple IC dies is through a bridge die in an interposer. Multiple such IC dies may be connected using a serializer/deserializer (SERDES) circuit. In such packaging architecture, the shoreline (i.e., peripheral edge) of the circuits is important mainly to offload data from one IC die to another or across multiple die stacks. Crossing bandwidth (BW) per linear length or area of the shoreline is a critical metric in measuring and comparing various packaging options for such multi-chip packages. One of the methods to increase bandwidth in such packages having multiple IC dies is to use reticle stitching within the IC dies.

In general, manufacturing an IC on a semiconductor wafer includes patterning the semiconductor wafer by an imaging process, such as photolithography. In the imaging process, the wafer is cleaned, pretreated, and spin-coated with a radiation-sensitive material, such as a photoresist. A surface of the wafer is subdivided into fields (also called stepper fields when used with a wafer stepper equipment) that may be individually exposed to the radiation. The fields may be arranged contiguously across the wafer in a grid with a uniform periodicity, such as in rows and columns. Each field may include one or more dies. Neighboring dies may be separated by a scribe region. The scribe region may also be known as a scribe line, a scribe street, or a kerf.

The imaging tool uses a photomask to form a pattern in the photoresist on the wafer. The pattern includes features (e.g., isolation, gate, contact, and first metal layers) for forming the layers of the IC device. The photomask used in the imaging process is called a reticle. A set of about 15-45 different reticles may be used to form the layers of the IC device. Many layers may only require use of a single reticle that may be specific to the layer. However, certain layers may require use of multiple reticles, such as gate layer which may use an alternating phase-shifting mask (APSM) and a trim mask. A typical image sensor's field of view through the reticle may include a pixel matrix (e.g., r by s pixels) in the center, circuit blocks on the left, right, and top sides, a readout part on the bottom, and four blocks at the four corners, containing various timing, reference and other metrology circuits.

The reticles used in typical semiconductor manufacturing processes are generally available only in sizes smaller than 33 mm by 26 mm, 700 mm$^2$, or 1 square inch in area. These upper limits are based on current industry conventions and are used as standards for configuring manufacturing tools, and are not intended to limit the present disclosure. In some cases, a single IC die is printed by a single reticle. In some cases, the IC dies printed by the reticle are not fully coextensive with the reticle size so as to leave room for strip that may include test structures or alignment marks (also referred to as "fiducials") that are used to align reticles during processing and test structures used for testing quality and/or reliability of IC components on a IC die. In some cases, the strip is also used as a scribe region. The scribe region is a sacrificial zone between individual fields that are free of functional circuits associated with the final IC because the scribe region is intended to be sawed through to separate the completed IC dies from one another.

In some instances, it may be advantageous to have an IC die that exceeds the reticle size of a single reticle. In a specific example, a large die, sometimes as much as two times, three times, or more of the maximum reticle size may be desired for computationally intensive applications (e.g., server or image processing applications). Some ICs may require photolithography over an area larger than the maximum available reticle size. To manufacture such ICs, and overcome reticle size limitations, a technique called "reticle stitching" is widely adopted. Reticle stitching allows a circuit designer to fabricate an image sensor that is larger than the field of view of the lithographic equipment, still making use of reticles that fit into the field of view of that equipment. Moreover, the size of such sensor will only be limited by the size of the semiconductor wafers, irrespective of reticle sizes.

In one example technique of reticle stitching, individual fields (i.e., stepper fields) are focused in the center pixel matrix of the image sensor. The circuit blocks represented by these fields can actually only operate in conjunction with each other on the physical device, i.e., they are not independent circuits during electrical operation and are considered independent merely for the manufacturing process. By appropriately programming the lithographic equipment, each individual field can be selected (e.g., by means of mechanical blading) and transferred into the photoresist on the wafer using a standard size reticle. In some embodiments, the transfer process may include a slight overlap (e.g., of 0.5 microns) between fields to ensure connectivity without any gaps in interconnecting structures. In this way it is possible to "stitch" the various circuit blocks together on the wafer during the lithographic process, resulting in a large monolithic circuit that is larger than a typical reticle. In current manufacturing processes, various lithographic tools have different sizes of the reticle field of view, but in general terms, full-format imagers (36 mm×24 mm) or larger produce such stitched devices. However, the bandwidth of such stitched devices is still limited by the interconnections available on the bridge die that couples two separate IC dies.

Accordingly, embodiments of the present disclosure provide a microelectronic assembly comprising: a first IC die including a plurality of first circuits (e.g., dynamic random access memory (DRAM) circuits) and scribe regions between adjacent ones of the first circuits; and a plurality of second IC dies coupled to the first IC die, each one of the second IC dies being coupled proximate and adjacent to a corresponding one of the first circuits and conductively coupled to the corresponding one of the first circuits. One or more of the second IC dies comprises a second circuit (e.g., physical layer interface (PHY) circuit, network circuit) different from the first circuit. In various embodiments, adjacent ones of the first circuits are coupled by a conductive pathway through the corresponding scribe regions, and the first IC die and the second IC die are coupled by interconnects having a pitch not more than 10 micrometers between adjacent interconnects.

In some embodiments of such a microelectronic assembly, stacks of the first IC dies having the DRAM circuits may be used, for example, to circumvent bandwidth problems of bridge dies in packaging architecture that uses stacks of high-bandwidth memory (HBM) connected by the bridge die to a processor die. Using IC die stacks of DRAM circuits can also provide a larger shoreline required for reticle stitching in both lateral directions of the IC dies. Further, the architecture of the microelectronic assembly can enable compute dies to be closer to the DRAM circuits because of the IC die stack in a vertical dimension rather than lateral connections in a plane, any interconnect distance in the former arrangement being shorter than in the latter. Reticle stitching of the DRAM circuits at multiple stack levels can also enable a unified memory architecture.

In some embodiments, a microelectronic assembly is provided, the microelectronic assembly comprising: a first IC die including a plurality of first circuits separated by scribe regions between adjacent ones of the first circuits, the adjacent ones of the first circuits being coupled by conductive pathways in the corresponding scribe regions; a second IC die coupled to the first IC die, the second IC die comprising a second circuit different from the first circuits; and a photonic IC (PIC) coupled to the second IC die on a side opposite to the first IC die. Using such PICs to couple multiple such microelectronic assemblies in a scale-out (e.g., blade to blade) configuration can enable higher bandwidth between the microelectronic assemblies also.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a SOI structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group Ill of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides, including optical fiber, optical splitters, optical combiners, optical couplers, and optical vias.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and printed circuit board (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substrate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
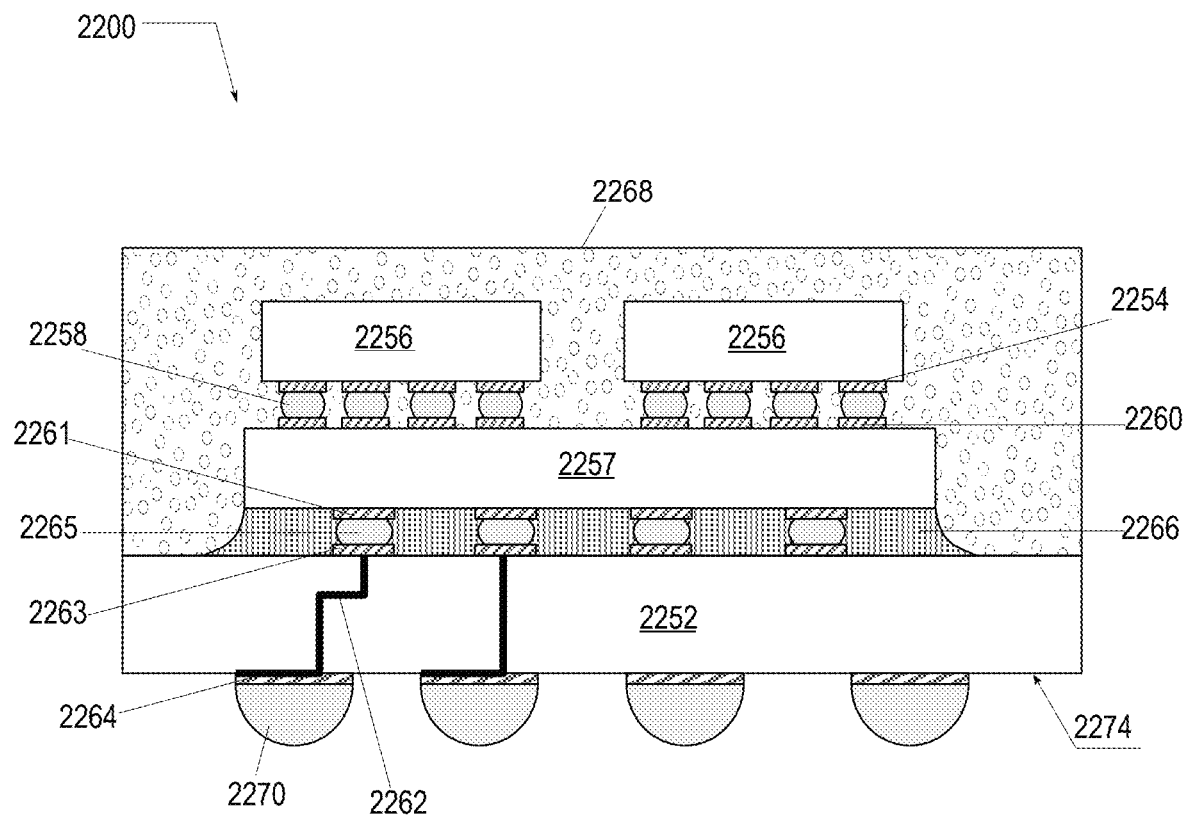
FIG. 10 is a cross-sectional view of a device package that includes one or more microelectronic assemblies in accordance with any of the embodiments disclosed herein.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112a-112e), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1 is a schematic cross-sectional view of an example microelectronic assembly 100 according to some embodiments of the present disclosure. Microelectronic assembly 100 comprises, in the embodiment shown, an IC die 102 including a plurality of DRAM circuits 104 and scribe regions 106 between adjacent ones of DRAM circuits 104. In various embodiments, DRAM circuits 104 may be approximately 700 mm$^2$ in area. In other embodiments, DRAM circuits 104 may be approximately 1 inch$^2$ in area. In yet other embodiments, DRAM circuits 104 may be approximately 33 mm by 26 mm in area. Various other sizes are also possible within the broad scope of the embodiments. In a general sense, DRAM circuits 104 may be of a size that is approximately similar to a maximum reticle size of a typical semiconductor manufacturing equipment. In other words, more than one DRAM circuit 104 may not fit within a size limitation of the maximum reticle size of the typical semiconductor manufacturing equipment.

In various embodiments, IC die 102 may be arranged as a stack of IC dies 102(1), . . . 102(N), and in the specific example shown in the figure, a stack of two IC dies 102(1) and 102(2) are shown. Note that any number of IC dies may be stacked thus within the broad scope of the embodiments. In the example embodiment shown, IC die 102(1) comprises two DRAM circuits 104(1) and 104(2). Any number of DRAM circuits 104 may be provisioned in IC die 102 within the broad scope of the embodiments. In various embodiments, IC dies 102(1) . . . 102(N) are coupled to each other by an interconnect layer 108. In some embodiments, interconnects in interconnect layer 108 comprise hybrid bonds, i.e., metal-metal bonds and oxide-oxide bonds as described further in relation to FIG. 1B.

Scribe region 106 is an area that would have been typically used to separate adjacent IC dies but does not serve such a function in IC die 102. Instead, adjacent ones of DRAM circuits 104 are coupled by a conductive pathway 110 through corresponding scribe regions 106. In various embodiments, conductive pathway 110 is provisioned in a layer 112 of dielectric material in scribe region 106. Layer 112 is distinct from interconnect layer 108. In various embodiments, layer 112 is between interconnect layer 108 and an active device layer (not shown) of IC die 102. Provisioning such conductive pathway 110 in scribe region 106 may be enabled by reticle stitching as described in the previous sections.

A plurality of IC dies 114 is coupled to IC die 102, each one of IC die 114 being coupled proximate and adjacent to a corresponding one of DRAM circuits 104 and conductively coupled to the corresponding one of DRAM circuits 104. One or more of IC dies 114 comprises another circuit 116 different from DRAM circuit 104. For example, circuit 116 may comprise a PHY circuit 116A, or a network circuit 116B, or some other circuit. In the example embodiment of the figure, two such IC dies 114 are shown; however, any number of IC dies 114 may be provisioned on IC die 102 as can be accommodated by IC die 102. In various embodiments, IC die 102 and IC die 114 are coupled by interconnects 118 having a pitch not more than 10 micrometers between adjacent ones of interconnects 118. In various embodiments, interconnects 118 may be of the same type (but not necessarily the same pitch) as interconnects in interconnect layer 108 between IC dies 102.

In various embodiments, a plurality of IC dies 120 may be coupled to corresponding ones of the IC dies 114 on a side of IC dies 114 opposite to IC die 102. In various embodiments, IC dies 120 may comprise circuits 122. At least some circuits 122 may be digital logic circuits and at least some circuits 122 may be random cache-memory circuits. Subsets of the plurality of third IC dies 120 are coupled to corresponding ones of IC dies 114 by interconnects 124 having a pitch not more than 10 micrometers between adjacent ones of interconnects 124. In various embodiments, interconnects 124 may be of the same type (but not necessarily the same pitch) as interconnects 118 or interconnects in interconnect layer 108 between IC dies 102. In various embodiments, IC dies 120 in any one subset may be coupled together by network circuit 116B in the corresponding IC die 114 to which the subset is coupled.

In various embodiments, a PIC 126 is coupled to one or more of IC dies 114 on a side of IC die 114 opposite to IC die 102 by interconnects 128 having a pitch not more than 10 micrometers between adjacent ones of interconnects 128. In various embodiments, interconnects 128 may be of the same type (but not necessarily the same pitch) as interconnects 124, or interconnects 118 or interconnects in interconnect layer 108 between IC dies 102. PIC 126 may be coupled to an optical fiber 130.

Microelectronic assembly 100 may further comprise a package substrate 132 with IC die 102 between package substrate 132 and the plurality of IC dies 114. In some embodiments, package substrate 132 may comprise organic dielectric material; in other embodiments, package substrate 132 may comprise inorganic materials such as glass, silicon, or ceramic. In embodiments where IC die 102 comprises a stack of IC dies 102, the stack of IC dies 102 is between the plurality of IC dies 114 and package substrate 132. IC die 102(including the stack of IC dies 102) may be coupled to package substrate with interconnects 134 having a pitch greater than 10 micrometers between adjacent ones of interconnects 134. In various embodiments, interconnects 134 may comprise DTPS interconnects as described in the previous subsection.

In various embodiments, IC dies 102 and 114 may comprise through-substrate vias (TSVs) 136. Thus, the plurality of IC dies 114 may be conductively coupled to package substrate 132 by TSVs 136 in the IC die 102(including the stack of IC dies 102). Likewise, IC dies 120 may be conductively coupled to IC die 102 by TSVs 136 in IC dies 114. In embodiments in which IC die 102 and IC die 114 are attached front-to-front, or in embodiments in which the back of IC dies 114 is attached to the front of IC die 102, digital logic circuit 122 in IC dies 120 may access DRAM circuits 104 in IC die 102 by TSVs 136 in IC dies 114. In embodiments in which the front of IC dies 114 is attached to the back of IC die 102, or in embodiments in which the back of IC dies 114 is attached to the back of IC die 102, digital logic circuit 122 in IC die 120 may access DRAM circuits 104 in IC die 102 by TSVs 136 in IC die 102 and IC die 114. In various embodiments, TSVs 136 may be sized suitably for signal, power and/or ground connections (e.g., TSVs 136 carrying power may be larger than TSVs 136 carrying signals).

FIG. 1B is a schematic cross-sectional view of a detail of interconnects 118 in microelectronic assembly 100. Note that although only interconnects 118 is shown, the same structure and description may apply to any other such interconnects (e.g., 124, 128 and interconnects in interconnect layer 108) comprising hybrid bonds in microelectronic assembly 100. In a general sense, interconnects 118 may comprise, at an interface 138 between IC die 102 and 114, metal-metal bonds between conductive contacts 140 and dielectric-dielectric bonds (e.g., oxide-oxide bonds) in dielectric material 142. At an interface 138 between IC die 102 and 114, conductive contact 140(1) belonging to IC die 114 may bond with conductive contact 140(2) of IC die 102; likewise, dielectric material 142(1) (e.g., silicon oxide, silicon nitride, silicon oxynitride, etc.) in IC die 114 may bond with dielectric 142(2) in IC die 102. The bonded materials form interconnects 118, comprising hybrid bonds, providing electrical and mechanical coupling between IC die 102 and IC die 114.

Embodiments as described herein provide scalable packaging architecture for processors such as graphics processing units (GPUs) and central processing units (CPUs), that can provide zetta ($10^{21}$) scale performance through reticle stitching. A stack of IC dies 102 having DRAM circuits 104 (for example, instead of a stack of IC dies having high-bandwidth memory (HBM) circuits) with reticle stitching for scale-up and photonics for scale-out can enable higher bandwidth than currently available packaging architecture using bridge dies. For example, replacing HBM circuits with a stack of two IC dies having DRAM circuits can provide a bandwidth of 20 GB/stack. In addition, locating DRAM circuits 104 near IC dies 120 having digital logic circuits 122 can enable faster processing speeds. Implementing reticle stitching at multiple levels in the stack of IC dies 102 can create a unified memory architecture across processors on a universal base board (UBB). In some embodiments, reticle stitching can enable 16 TB per second signal speeds with a 20 mm shoreline (peripheral edge around DRAM circuit 104) contributing 0.8 TB per second signal speeds.

FIG. 2A is a schematic top view of a portion of the example microelectronic assembly 100 of FIG. 1A. DRAM circuits 104(1) and 104(2) may be separated by scribe region 106. Conductive pathway 110 may comprise a plurality of metal lines 202) through scribe region 106. Conductive pathway 110 may be disposed in scribe region 106 by reticle stitching techniques such that DRAM circuits 104(1) and 104(2) are conductively coupled. In various embodiments, scribe region 106 may comprise one or more alignment marks 204. Alignment mark 204 may be of any suitable shape, size, number, etc. In some embodiments, alignment mark 204 may comprise periodic structures formed by mark lines in scribe region 106. Alignment mark 204 may serve to measure a position of DRAM circuits 104 by alignment sensors during the manufacturing process to position IC die 102 with respect to processing equipment, such as a projection system and a patterning machine.

FIG. 2B is a schematic top view of certain details in a portion 205 of IC die 102 shown in FIG. 2A. Each metal line 202 may comprise three regions: a transmission region 206, a reception region 208, and a stitch region 210 between transmission region 206 and reception region 208. In various embodiments, transmission region 206 and reception region 208 may comprise memory arrays, for example, to process incoming and outgoing signals appropriately. Adjacent metal lines 202 are separated by metrology regions 212 adjacent to stitch regions 210. Metrology region 212 may comprise test structures conductively uncoupled from DRAM circuits 104. For example, the test structures are used for process monitoring, and can comprise various metrology circuits including test pads that provide an interface for electrical tests by a testing equipment, such as a wafer probe. In other embodiments, metrology region 212 may comprise a region without any metal structures.

FIG. 2C is a schematic cross-sectional view along axis C-C' of certain details in portion 205 of IC die 102 shown in FIG. 2A. IC die 102 may comprise a metallization stack 214 comprising a plurality of layers of one or more interlayer dielectric (ILD) materials 216, conductive traces 218 surrounded by ILD material 216, and conductive vias 220 in ILD material 216 conductively coupling conductive traces 218 in different layers.

A first subset of layers 222 comprising layers 222(1) ... 222(N) comprises conductive traces 218 having a first pitch between adjacent conductive traces 218. A second subset of layers 224 comprising layers 224(1) ... 224(M) comprises conductive traces 218 with a second pitch between adjacent conductive traces. In some embodiments, the first pitch is less than or equal to 360 nanometers and the second pitch is more than 360 nanometers. In some embodiments, first subset of layers 222 comprises up to seven layers, and second subset of layers 224 comprises up to four layers. Any number of layers may be provisioned in first subset of layers 222 and second subset of layers 224 within the broad scope of the embodiments. In some embodiments, second subset of layers 224 may be disposed between interconnect layer 108 and first subset of layers 222. In various embodiments, layer 112 includes second subset of layers 224. Metal lines 202 may be used for signals, power and/or ground connections as appropriate, with commensurate metal thickness and pitches. For example, metal lines 202 providing power may be thicker than metal lines 202 providing signals, and the former may be located in layers within second subset of layers 224 that are closer to interconnect layer 108. Stitching power grid connections in this manner can avoid non-uniform droop issues in IC die 102.

Conductive pathway 110 is disposed in second subset of layers 224. In various embodiments, conductive pathway 110 may occupy multiple layers of second subset of layers 224, for example, with individual metal lines 202 in respective layers. Various passive components 226 may be disposed in second subset of layers 224. For example, passive component 226 may comprise a metal-insulator-metal (MIM) capacitor as shown in the figure. For ease of illustration, and to not clutter, MIM capacitor of passive component 226 is shown as a homogeneous layer of material; however, those skilled in the art will understand that the MIM capacitor comprises conductive plates spaced apart by dielectric material which may be different from ILD material 216. In the figure, the portion of conductive pathway 110 shown is disposed in stitch region 210. Metrology region 212, which is adjacent to stitch region 210, comprises metal structures 228 including conductive traces 218 and conductive vias 220 extending through first subset of layers 222, second subset of layers 224 and interconnect layer 108 in some embodiments. In other embodiments (not shown) metrology region 212 may not comprise any metal structures 228.

FIG. 3 is a schematic top view of another example microelectronic assembly 100 according to some embodiments of the present disclosure. Microelectronic assembly comprises package substrate 132 to which is coupled IC die 102 comprising a plurality of DRAM circuits 104(1) and 104(2) and scribe region 106 between DRAM circuits 104. Note that although only two DRAM circuits 104(1) and 104(2) are shown, any number of DRAM circuits 104 may be provisioned in IC die 102 within the broad scope of the embodiments. Conductive pathway 110 between DRAM circuits 104(1) and 104(2) through scribe region 106 may be enabled by reticle stitching techniques. Thus, substantially all DRAM circuits 104 in IC die 102 may be interconnected without resort to an external coupling mechanism, such as a bridge die or coupling through any package substrate. Note that conductive pathway 110 shown is merely representative; conductive pathway 110 may comprise a plurality of conductive traces between DRAM circuits 104(1) and 104(2) as described in reference to FIGS. 2A-2C.

A plurality of IC dies 114(1) and 114(2) are coupled to the IC die 102, each one of IC dies 114(1) and 114(2) proximate to and conductively coupled to a corresponding one of DRAM circuits 104(1) and 104(2) respectively. IC dies 114 may comprise various different circuits therein, for example, PHY circuit 116A and network circuit 116B. In some embodiments, other circuits 116 may include Peripheral Component Interconnect Express (PCIe) circuits, driver circuits, amplifier circuits, SERDES circuits, etc.

A plurality of IC dies 120 are coupled to plurality of IC dies 114, distinct subsets of the plurality of IC dies 120 being coupled to separate ones of IC dies 114 on sides of IC dies 114 opposite to IC die 102. For example, a subset comprising IC dies 120(1) is coupled to IC die 114(1) and another subset comprising IC dies 120(2) is coupled to IC die 114(2). Each subset of the plurality of IC dies 120 is conductively coupled together by network circuit 116B in the corresponding IC die 114 to which the subset is coupled (e.g., subset comprising plurality of IC dies 120(1) is coupled together by network circuit 116B(1) in IC die 114(1) and another subset comprising plurality of IC dies 120(2) is coupled together by network circuit 116B(2) in IC die 114(2). Some of IC dies 120 may comprise digital logic circuits 122A and some others of IC dies 120 may comprise random cache-memory circuits 122B. Note that IC dies 120 may comprise various other circuits within the broad scope of the embodiments.

At least one PIC 126 is coupled to at least one of IC dies 114, e.g., 114(1). PIC 126 is configured to couple to an optical fiber for enabling communication between different microelectronic assemblies 100. In various embodiments, a single package substrate 132 may be coupled to a single IC die 102; a single IC die 102 may be coupled to a plurality of IC dies 114; a single IC die 114 may be coupled to a plurality of IC dies 120. Thus, various IC dies (e.g., 102, 114, 120) may be stacked together on package substrate 132 in a hierarchical packaging architecture.

Figure 4:
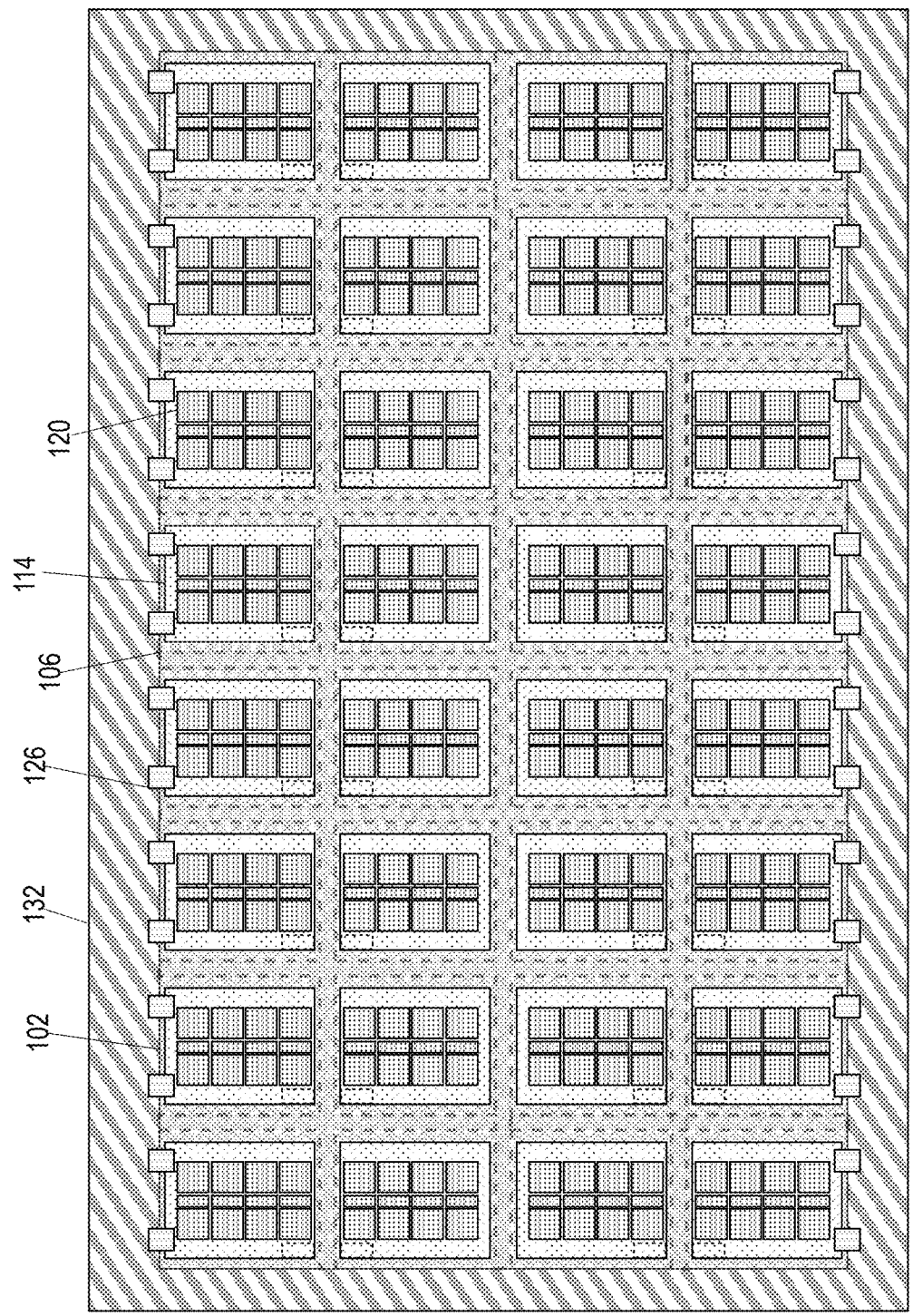
FIG. 4 is a schematic top view of yet another example microelectronic assembly according to some embodiments of the present disclosure.

FIG. 4 is a schematic top view of yet another example microelectronic assembly 100 according to some embodiments of the present disclosure. Microelectronic assembly 100 is similar to the embodiment shown in FIG. 3 except that several more IC dies 114 and 120 are included therein. Microelectronic assembly 100 may comprise package substrate 132 to which is coupled IC die 102 comprising a plurality of DRAM circuits 104 (not shown so as not to clutter the drawing) and a plurality of scribe regions 106 not shown so as not to clutter the drawing), each scribe region between adjacent ones of DRAM circuits 104. Conductive pathways 110 (not shown so as not to clutter the drawing) between adjacent DRAM circuits 104 through scribe regions 106 may be enabled by reticle stitching techniques. Thus, substantially all DRAM circuits 104 may be interconnected without resort to an external coupling mechanism, such as a bridge die or coupling through package substrate 132.

A plurality of IC dies 114 are coupled to IC die 102, each one of IC dies 114 proximate to and conductively coupled to a corresponding one of DRAM circuits 104. Distinct subsets of a plurality of IC dies 120 are coupled to separate ones of IC dies 114 on sides of IC dies 114 opposite to IC die 102. Each subset of the plurality of IC dies 120 is conductively coupled together by a network circuit 116B ((not shown so as not to clutter the drawing) in the corresponding IC die 120 to which the subset is coupled, and adjacent ones of DRAM circuits 104 are conductively coupled by conductive pathways 110 (not shown so as not to clutter the drawing) through the respective scribe regions. A plurality of PIC 126 is coupled to subsets IC dies 114, for example, those IC dies 114 that are closer to an edge of package substrate 132. Communication from other IC dies 114 not coupled to any PIC 126 may be routed through one or more of the particular IC dies 114 coupled to PICS 126.

Such packaging architecture can enable reducing a footprint of all the IC dies in microelectronic package 100 such that more number of DRAM circuits 104 and/or IC dies 102, 114 and/or 120 may be included within the same form-factor as a traditional package that does not have reticle stitching as described herein. In such traditional packages, HBM circuits in IC die stacks are typically disposed laterally to IC dies such as IC dies 114 or IC dies 120. In contrast, DRAM circuits with similar functionality as HBM circuits may be disposed in a single wafer or panel comprising IC die 102 vertically (e.g., underneath, or over) IC dies 114 and 120 in various embodiments. In an example embodiment, a single wafer with wafer level reticle stitching as described herein can hold up to 16 GPUS or 32 tiles of such GPUs and can replace existing packages that do not have reticle stitching on the same PCB, thus providing wafer-level GPU scaling for significant upgrade in performance.

In such embodiments, microelectronic assembly 100 may encompass functionalities of an entire module also called "blade", such as a server module, switch module, or router module etc. as the case may be of a blade server, switch, router, etc. Microelectronic assembly 100 may be rack-mounted, for example, by connecting to an appropriate backplane containing optical fibers that may couple to PICS 126. Multiple such blades may communicate with each other in the rack. In other embodiments, multiple ones of microelectronic assembly 100 may be mounted inside a common chassis and may communicate with each other over optical fibers coupled to respective PICs 126.

Figure 5:
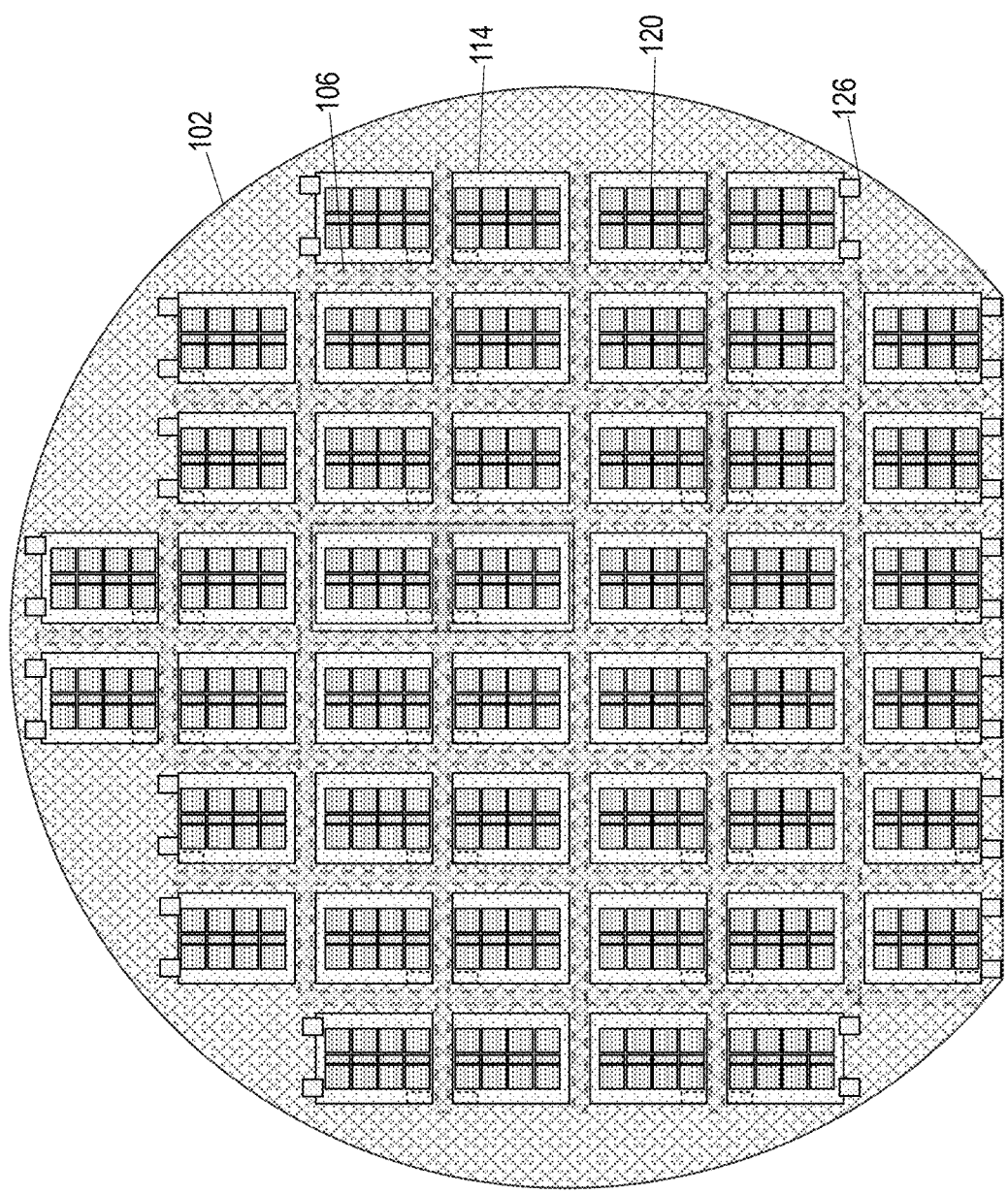
FIG. 5 is a schematic top view of yet another example microelectronic assembly according to some embodiments of the present disclosure.

FIG. 5 is a schematic top view of yet another example microelectronic assembly 100 according to some embodiments of the present disclosure. Microelectronic assembly 100 of the figure is similar to the embodiment shown in FIG. 4 except that package substrate 132 is absent and IC die 102 comprises a monolithic semiconductor wafer. In such embodiments, the functions of package substrate 132 may be dispensed with by moving the package substrate functions into IC dies 102, 114, 120, etc. as appropriate, or onto a common backplane to which the wafers are mounted. In such embodiments, IC die 102 may comprise circuits other than DRAM circuits 104; such circuits are not included in the figure so as not to clutter the drawing. Conductive pathways 110 (not shown so as not to clutter the drawings) between adjacent DRAM circuits 104 through scribe regions 106 may be enabled by reticle stitching techniques. Substantially all DRAM circuits 104 may be interconnected without resort to an external coupling mechanism, such as a bridge die or coupling through any package substrate.

As discussed with regard to the embodiment shown in the previous figure, microelectronic assembly 100 may encompass functionalities of an entire blade of a blade server, switch, router, etc. Microelectronic assembly 100 may be rack-mounted, for example, by connecting to an appropriate backplane containing optical fibers that may couple to PICS 126. Multiple such blades may communicate with each other in the rack. In other embodiments, multiple ones of microelectronic assembly 100 may be mounted inside a common chassis and may communicate with each other over optical fibers coupled to respective PICs 126.

Figure 6:
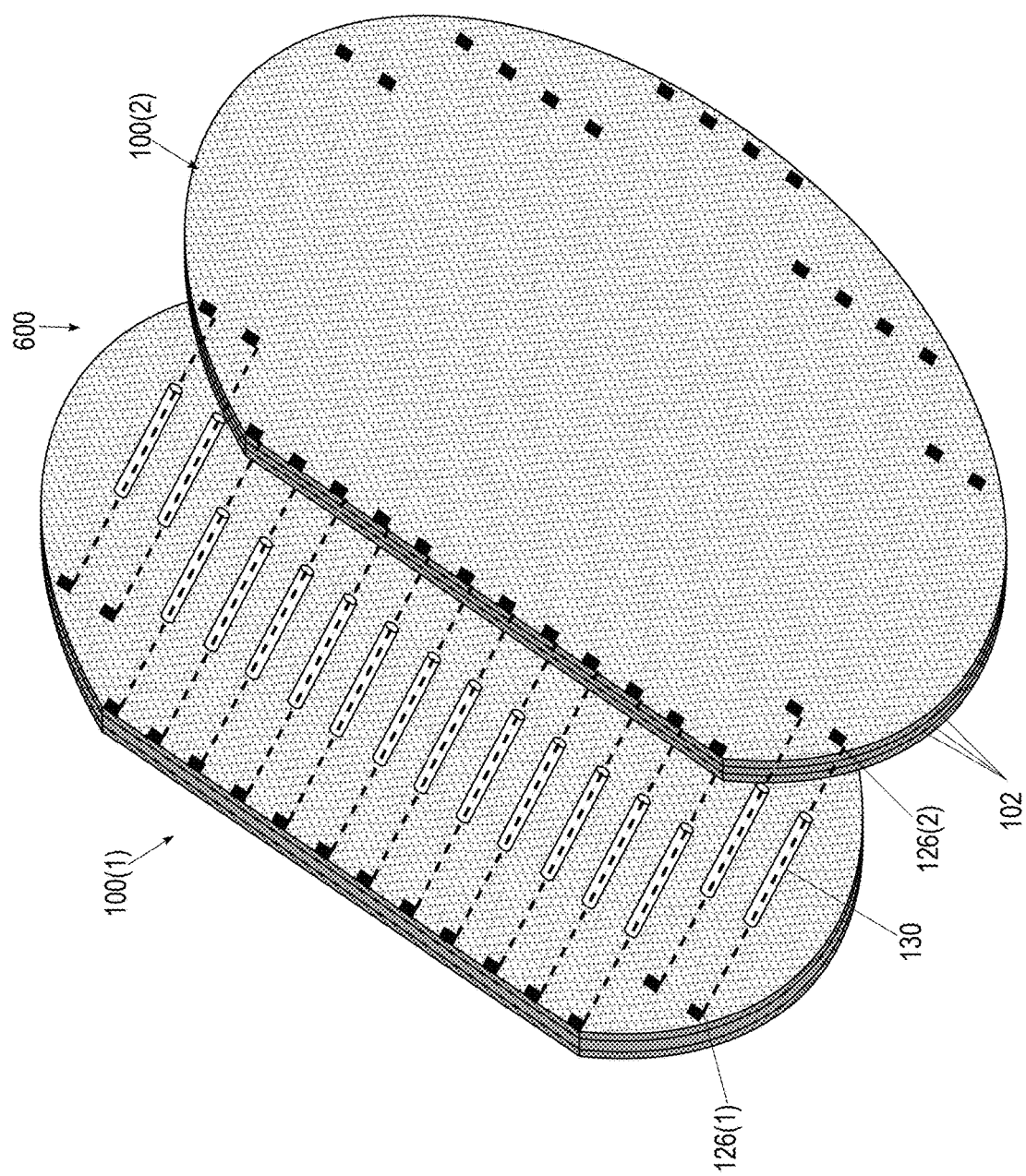
FIG. 6 is a schematic exploded view of an example microelectronic system according to some embodiments of the present disclosure.

FIG. 6 is a schematic exploded view of an example microelectronic system 600 according to some embodiments of the present disclosure. Microelectronic system 600 may include a plurality of microelectronic assemblies 100 (e.g., 100(1) and 100(2)) as discussed in reference to the previous figures, coupled by optical fibers 130. Each microelectronic assembly 100 may include multiple IC dies 102 stacked one over another and coupled together by suitable DTD interconnects as discussed in regard to previous figures. In such embodiments, IC die 102 may comprise the stack of IC dies coupled together by suitable interconnects as discussed in reference to previous figures. In some embodiments (as shown) each IC die 102 may also be shaped and sized as a panel (e.g., as in FIG. 4) or semiconductor wafer (e.g., as shown in FIG. 5). A panel differs from a wafer only in its geometry: the panel may be rectangular, whereas the wafer may be approximately circular. The panel may be approximately 600 mm by 600 mm in some embodiments. The wafer may have a diameter of 6 inches or 12 inches. Various circuits are fabricated in IC die 102 and various other individual IC dies, such as IC dies 114, 120, etc. are attached by suitable interconnects as discussed with reference to previous figures. These other IC dies, which are each smaller than IC die 102 as discussed in the previous figures, are not shown in FIG. 6 merely for ease of illustration and so as not to clutter the drawing.

PICs 126 may be coupled to such other IC dies and may also be attached to respective optical fibers 130. PICs 126 in two different microelectronic assemblies 100 may communicate through optical fibers 130. For example, in various embodiments, electrical signals from various IC dies in a particular microelectronic assembly 100(1) may be aggregated and sent to a particular one of PICs 126, for example, PIC 126(1) coupled to such various IC dies. PIC 126(1) may convert the electrical signals to optical signals by techniques known in the art. The optical signals are transmitted over optical fiber 130 coupled to PIC 126(1) to PIC 126(2) in another microelectronic assembly 100(2).

Figure 7A:
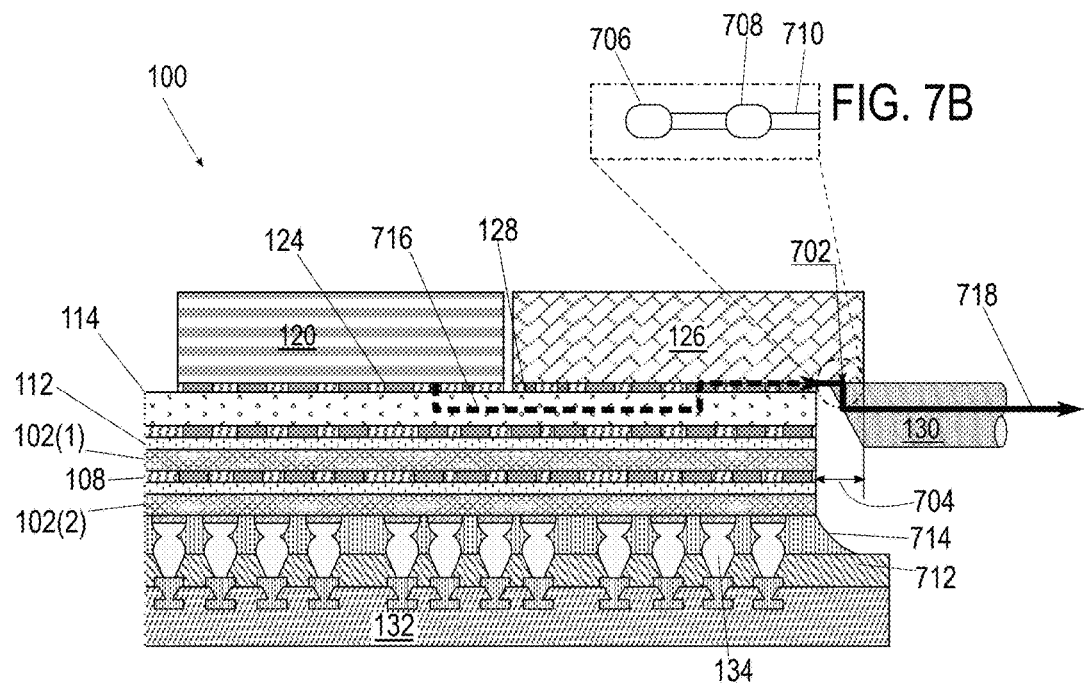
FIG. 7A is a schematic cross-sectional view of a portion of yet another example microelectronic assembly according to some embodiments of the present disclosure.

FIG. 7A is a schematic cross-sectional view of a portion of yet another example microelectronic assembly according to some embodiments of the present disclosure. Note that some component parts of interconnects are shown in FIG. 1A but are not labeled separately so as not to clutter the drawing. Some additional components may be present but are not shown for ease of illustration and to not clutter the drawing. Many of the features of microelectronic assembly 100 shown and/or labeled in the figure are the same or similar to embodiments shown in previous figures and are therefore not described here for the sake of brevity.

As shown, microelectronic assembly 100 may include PIC 126, which is coupled to IC die 114 in such a way that PIC 126 extends beyond an edge of IC die 114 by an overhang 704, exposing an overhanging surface 702 on a side of PIC 126 proximate to IC die 114. Overhanging surface 702 comprises various optical structures 706-710 that are optically coupled to optical fiber 130. Other components, such as optical lens, couplers etc. may be present between optical structures on overhanging surface 702 and optical fiber 130. Optical fiber 130 may facilitate optical coupling of microelectronic assembly 100 to other parts of a system, such as microelectronic system 600 discussed in reference to FIG. 6. In some embodiments PIC 126 may have V-grooves monolithically integrated into overhanging surface 702; in such embodiments, optical fiber 130 may comprise optical fiber arrays coupled to PIC 126 along the exposed V-grooves, for example, self-aligned along the corresponding V-grooves. In a general sense, V-grooves comprise inverted tapers (grooves) pressed or etched into a substrate such as silicon.

Example optical structures 706-710 on overhanging surface 702 are shown in more detail in FIG. 7B. FIG. 7B is a schematic bottom view of overhanging surface 702 (for example, looking up at overhanging surface 702 from underneath PIC 126). Example optical structures include an electromagnetic radiation source 706, an electro-optical device 708, and a waveguide 710. In many embodiments, the optical structures may be fabricated on overhanging surface 702 using any known method in the art, including semiconductor photolithographic and deposition methods. In some embodiments, the optical structures may extend substantially across an entire surface of PIC 126 proximate to IC die 114. In some other embodiments, the optical structures may be confined within a portion of such surface, for example, on overhanging surface 702.

Electromagnetic radiation source 706 can enable generating optical signals and may include lasers, for example if PIC 126 supports wavelengths between about 0.8 and 1.7 micrometer; or oscillators, for example, if PIC 126 supports wavelengths on a millimeter scale; or some combination of lasers and oscillators, for example, if PIC 126 supports wavelengths between 0.8 micrometer and 5 centimeters. Electro-optical device 708 can enable receiving, transforming, and transmitting optical signals. In some embodiments, electro-optical device 708 may be any device or component configured to encode information in/on to the electromagnetic signals, such as modulator, polarizer, phase shifter, and photodetector.

Waveguide 710 can guide optical signals and also perform coupling, switching, splitting, multiplexing and demultiplexing optical signals. In some embodiments, waveguide 710 may include any component configured to feed, or launch, the electromagnetic signal into the medium of propagation such as an optical fiber. In some embodiments, waveguide 710 may further be configured as optical multiplexers and/or demultiplexers, for example, to perform a frequency division multiplexing (FDM) or wavelength division multiplexing (WDM). In some embodiments, waveguide 710 may include a de-multiplexer, such as Arrayed Waveguide Grating (AWG) de-multiplexer, an Echelle grating, a single-mode waveguide, or a thin film filter (TFF) de-multiplexer.

Waveguide 710 may comprise planar and non-planar waveguides of any type. In one example, waveguide 710 may comprise a SOI platform, configured to guide electromagnetic radiation of any wavelength bands from about 0.8 micrometer to about 5 centimeters. In another example, waveguide 710 may support wavelengths from about 1.2 micrometer to about 1.7 micrometer in the near-infrared and infrared bands for use in data communications and telecommunications. In another example, waveguide 710 may support wavelengths from about 1 millimeter to about 10 millimeters (used in extremely high frequency (EHF) band of radio/micro-waves), and in particular, wavelengths of about 2 millimeter may be used for radar and radio frequency (RF) wireless communications.

Although only three such example optical structures are illustrated, it may be understood that PIC 126 may include more optical structures of the same or different types that enable it to function appropriately as a photonic device receiving, transforming, and transmitting optical and electrical signals.

In some embodiments, the optical structures on overhanging surface 702 may be covered with a protective layer (not shown) of suitable material, such as optical epoxy. The protective layer enables maintaining integrity of the optical structures during fabrication processes to which PIC 126 may be subjected, for example, attaching, solder reflowing, grinding, polishing, underfilling, and molding. The protective layer may ensure, for example, that optical transmission properties of the optical structures are not compromised during the fabrication processes by contamination with mold or underfill material, or that optical functionality is not compromised by tearing, breaking, or other destructive events during the fabrication processes. The protective layer may also serve to avoid leaking optical signals from the optical structures, including waveguide 710, during operation of PIC 126.

In general, the light provided to PIC 126 may include any electromagnetic signals having information encoded therein (or, phrased differently, any electromagnetic signals modulated to include information). Often times, the electromagnetic signals are signals associated with optical amplitudes, phases, and wavelengths and, therefore, descriptions provided herein refer to "optical" signals (or light) and "optical" components (e.g., "electro-optical device 708"). However, PIC 126, as described herein, is not limited to operating with electromagnetic signals of optical spectrum and descriptions provided herein with reference to optical signals and/or optical components are equally applicable to electromagnetic signals of any suitable wavelength, such as electromagnetic signals in near-infrared (NIR) and/or infrared (IR) bands, as well as electromagnetic signals in the RF and/or microwave bands. PIC 126 may comprise a semiconductor material as enumerated in the preceding section in reference to IC dies.

Turning back to FIG. 7A, microelectronic assembly 100 may include various features not shown in previous figures, such as solder resist 712 (e.g., organic polymer material such as benzotriazole, imidazole, polyimide, or epoxy) and underfill 714 may be present between package substrate 132 and IC die 102 (e.g., 102(2)). In various embodiments, underfill 714 may comprise thermoset epoxies with silicon oxide particles; in some embodiments, underfill 714 may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations. In some embodiments, solder resist 712 may be a liquid or dry film material including photo-imageable polymers. In some embodiments, solder resist 712 may be non-photo-imageable.

During operation of microelectronic assembly 100, electrical signals, for example, 716 may be generated in a digital logic circuit (not shown) of IC die 120. Electrical signals 716 may travel through interconnects 124 between IC die 120 and IC die 114, then through IC die 114, for example, in a network circuit (not shown) coupled to the digital logic circuit, and then through interconnects 128 to PIC 126. PIC 126 may convert electrical signals 716 to optical signals 718, which may traverse optical structures such as waveguides 710 on overhanging surface 702. Optical signals 718 may be transmitted out of microelectronic assembly 100 through optical fiber 130. Similar operations apply for incoming optical signals (not shown) which are converted to electrical signals in PIC 126 and then sent through IC die 114 to IC dies 120 as appropriate.

Figure 8:
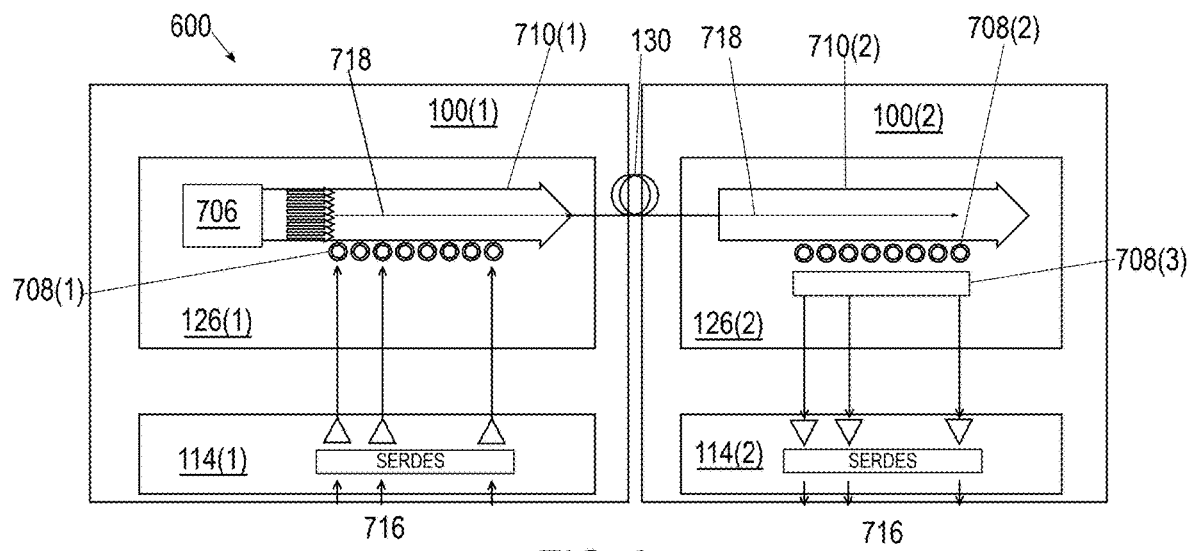
FIG. 8 is a schematic block diagram of a portion of an example microelectronic assembly according to some embodiments of the present disclosure.

FIG. 8 is a schematic block diagram of a portion of an example microelectronic system 600 according to some embodiments of the present disclosure. In the figure, communication between two microelectronic assemblies 100(1) and 100(2) are shown. Electrical signals 716 generated in microelectronic assembly 100(1), for example, in IC die 120 (not shown) may be communicated to a SERDES circuit in IC die 114(1). Driver circuits (and other appropriate circuits) in IC die 114(1) may transmit electrical signals 716 to PIC 126(1) over conductive traces and interconnects such as interconnects 128 that couple the optical structures in PIC 126 with circuit 116 (not shown) in IC die 114. In various embodiments, the SERDES circuit, driver circuits and other such circuits may form part of circuit 116, such as network circuit 116B and/or PHY circuit 116A. Electromagnetic radiation source 706, comprising a multi-wavelength laser in PIC 126(1) may generate lasers in a plurality of wavelengths. Electro-optical device 708(1), for example, comprising ring modulators, may convert electrical signals 716 to optical signals 718 (not shown) using electromagnetic waves generated by electromagnetic radiation source 706. Optical signals 718 may be transmitted over waveguide 710(1) to optical fiber 130 and therethrough to waveguide 710(2) in PIC 126(2), which is part of microelectronic assembly 100(2). Electro-optical device 708(2), for example, comprising ring modulators, may convert optical signals 718 to electrical signals 716 using another electro-optical device 708(3), for example, a photodetector. Photodetectors are configured to convert incoming optical signals 718 into an electrical signals 716. In some embodiments, the photodetectors in PIC 126 may comprise photodiodes. Electrical signals 716 may then be sent to IC die 114, where amplifiers and SERDES circuits as appropriate may process them before sending them on to other components in microelectronic assembly 100(2).

In various embodiments, any of the features discussed with reference to any of FIGS. 1-8 herein may be combined with any other features to form a package with one or more IC dies as described herein, for example, to form a modified microelectronic assembly 100. Some such combinations are described above, but, in various embodiments, further combinations and modifications are possible.

Example Methods

Figure 9:
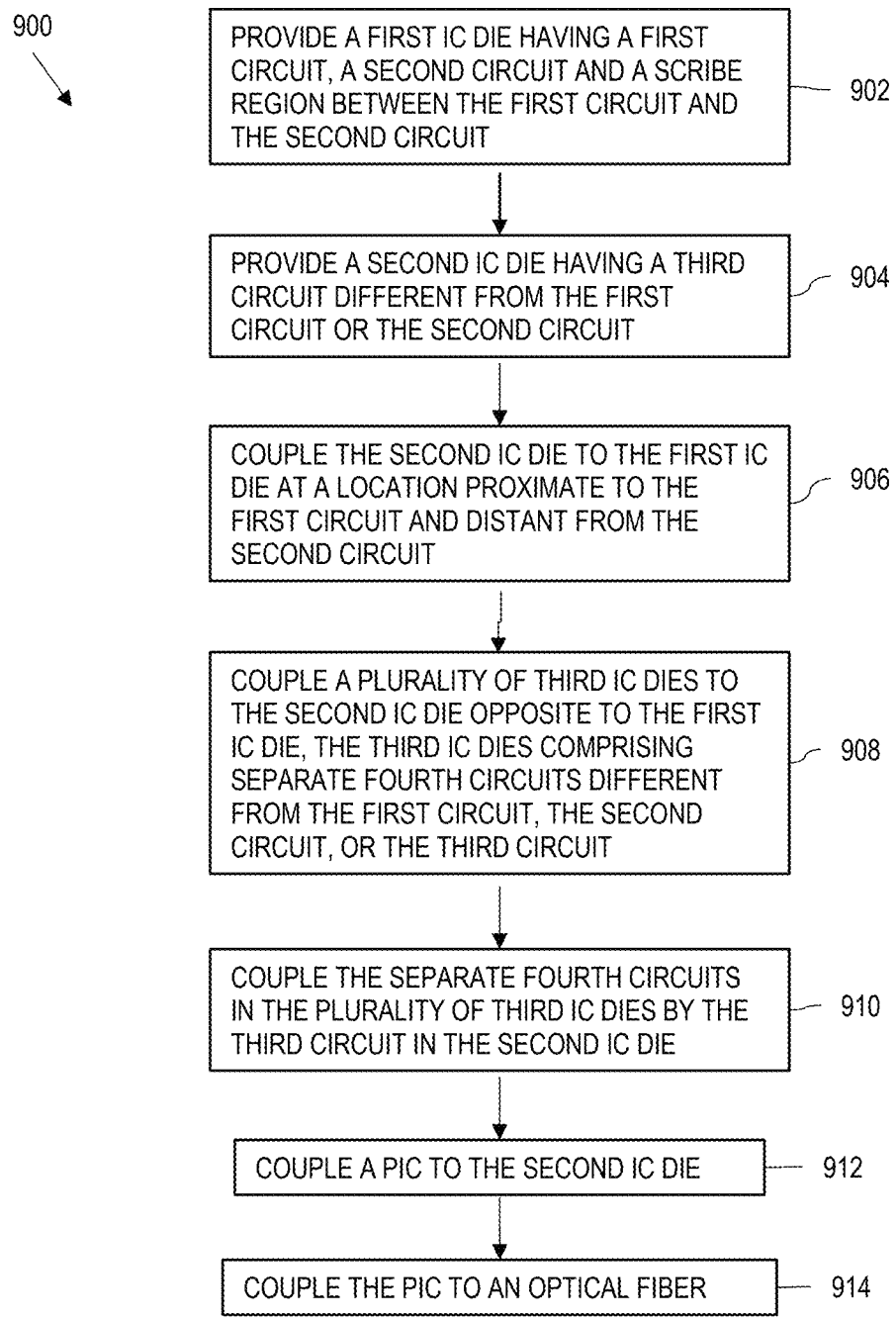
FIG. 9 is a schematic flow diagram of operations associated with an example microelectronic assembly according to some embodiments of the present disclosure.

FIG. 9 is a schematic flow diagram illustrating certain operations 900 associated with various embodiments of microelectronic assembly 100 of the present disclosure. At 902, a first IC die (e.g., 102) having a first circuit (e.g., 104(1)), a second circuit (e.g., 104(2)) and a scribe region (e.g., 106) between the first circuit and the second circuit is provided. In example embodiments, the first circuit and the second circuit comprise memory circuits, for example, DRAM circuits. As described in reference to FIGS. 1-8, the first circuit and the second circuit are coupled by a conductive pathway (e.g., 110) through the scribe region fabricated using reticle stitching techniques. In some embodiments, IC die 102 may comprise a stack of IC dies, each IC die in the stack having the first circuit and the second circuit separated by the scribe region and coupled by a conductive pathway in the scribe region. The IC dies in the stack may be coupled to each other by an interconnect layer 108 in which adjacent interconnects have a pitch less than 10 micrometers, using various manufacturing operations known in the art, including hybrid bonding, micro-bump soldering, etc.

At 904, a second IC die (e.g., 114) is provided having a third circuit (e.g., 116) different from the first circuit or the second circuit. In example embodiments, the third circuit comprises a PHY circuit, a network circuit, a SERDES circuit, a driver circuit, an amplifier circuit, etc. At 906, the second IC die is coupled to the first IC die at a location proximate to the first circuit and distant from the second circuit by interconnects 118 using various manufacturing operations known in the art, including hybrid bonding, micro-bump soldering, etc. In some embodiments, another one of the second IC dies may also be coupled to the first IC die at a location proximate to the second circuit and distant from the first circuit.

At 908, a plurality of third IC dies (e.g., 120) is coupled to the second IC die opposite to the first IC die by interconnects 124 using various manufacturing operations known in the art, including hybrid bonding, micro-bump soldering, etc. In many embodiments, the third IC dies comprise separate fourth circuits (e.g., 122) different from the first circuit, the second circuit, or the third circuit. In example embodiments, the fourth circuits comprise digital logic circuits and/or random cache-memory circuits. At 910, the separate fourth circuits in the plurality of third IC dies are coupled by the third circuit in the second IC die. For example, in some embodiments, the separate fourth circuits are coupled by the network circuit in the second IC die.

At 912, a PIC 126 may be coupled to the second IC die by interconnects 128 using various manufacturing operations known in the art, including hybrid bonding, microbump soldering, etc. In various embodiments where more than one of the second IC dies are coupled to IC die 102, a plurality of PIC may be coupled to the plurality of second IC dies. At 914, PIC 126 may be coupled to optical fiber 130. Further, a plurality of microelectronic assemblies 100 may be coupled by optical fiber 130. PIC 126 may convert electrical signals to optical signals. Thus, signals within any one microelectronic assembly 100 may be electrical signals, and signals between microelectronic assemblies 100 may be optical signals.

Although FIG. 9 illustrates various operations performed in a particular order, this is simply illustrative, and the operations discussed herein may be reordered and/or repeated as suitable. Further, additional processes which are not illustrated may also be performed without departing from the scope of the present disclosure. Also, various ones of the operations discussed herein with respect to FIG. 9 may be modified in accordance with the present disclosure to fabricate others of microelectronic package 100 disclosed herein. Although the operations of the operations 900 are illustrated in FIG. 9 once each, the operations may be repeated as often as desired. For example, one or more operations may be performed in parallel to manufacture multiple microelectronic packages substantially simultaneously. In another example, the operations may be performed in a different order to reflect the structure of a particular microelectronic package 100 as described herein.

Furthermore, the operations illustrated in FIG. 9 may be combined or may include more details than described. Still further, operations 900 may further include other manufacturing operations related to fabrication of other components of the microelectronic assemblies described herein, or any devices that may include the microelectronic assemblies as described herein. For example, operations 900 may include various cleaning operations, surface planarization operations (e.g., using chemical mechanical polishing (CMP)), operations for surface roughening, operations to include barrier and/or adhesion layers as desired, and/or operations (e.g., solder reflow, epoxy curing, etc.) for incorporating microelectronic packages as described herein in, or with, an IC component, a computing device, or any desired structure or device.

Example Devices and Components

Figure 11:
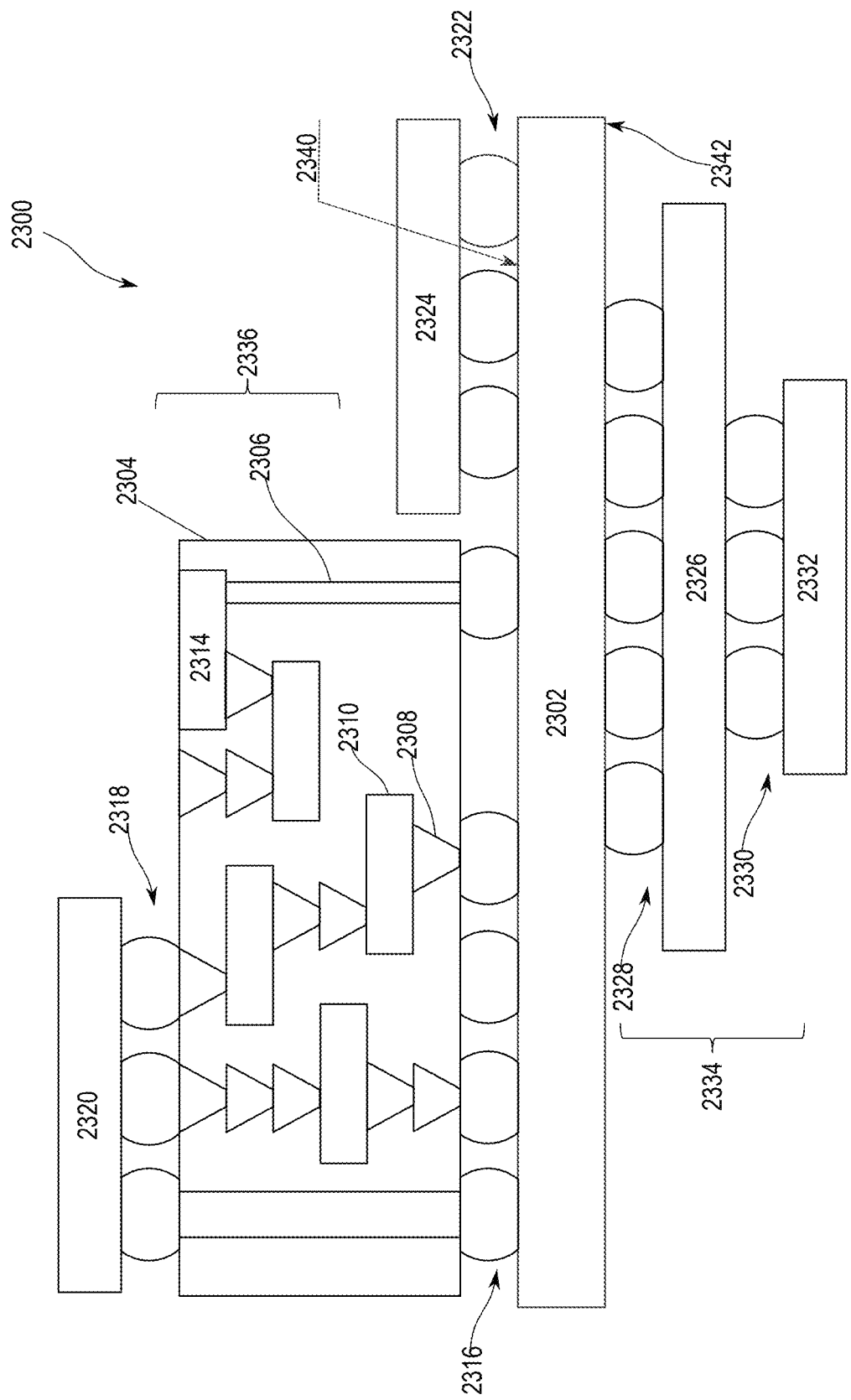
FIG. 11 is a cross-sectional side view of a device assembly that includes one or more microelectronic assemblies in accordance with any of the embodiments disclosed herein.
Figure 12:
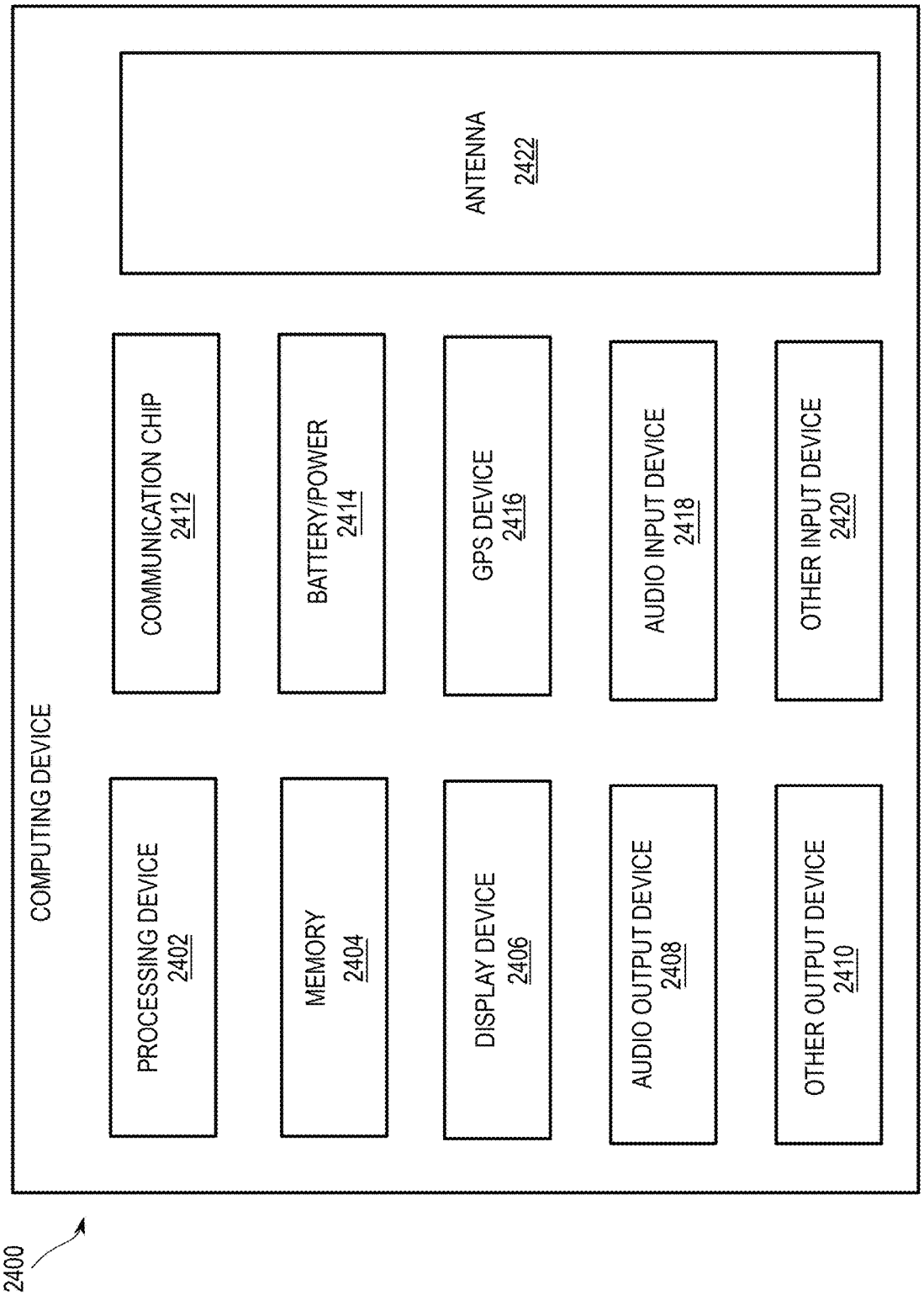
FIG. 12 is a block diagram of an example computing device that includes one or more microelectronic assemblies in accordance with any of the embodiments disclosed herein.

The packages disclosed herein, e.g., any of the embodiments shown in FIGS. 1-9 or any further embodiments described herein, may be included in any suitable electronic component. FIGS. 10-12 illustrate various examples of packages, assemblies, and devices that may be used with or include any of the IC packages as disclosed herein.

FIG. 10 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 11.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 11 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 10.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 10. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as RF devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 12 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 10). In yet another example, any one or more of the components of computing device 2400 may include an IC device assembly 2300 (e.g., as shown in FIG. 11).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-chip (SOC) die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, memory 2404 may include memory that shares a die with processing device 2402. This memory may be used as cache-memory and may include embedded-DRAM (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides a microelectronic assembly (e.g., 100, FIG. 1A), comprising: a first IC die (e.g., 102) including a plurality of first circuits (e.g., 104) separated by scribe regions (e.g., 106) between adjacent ones of the first circuits; and a plurality of second IC dies (e.g., 114) coupled to the first IC die, each one of the second IC dies being coupled proximate and adjacent to a corresponding one of the first circuits and conductively coupled to the corresponding one of the first circuits, in which: one or more of the second IC dies comprises a second circuit (e.g., 116) different from the first circuit, adjacent ones of the first circuits are coupled by a conductive pathway (e.g., 110) through the scribe regions, and the first IC die and the second IC die are coupled by interconnects (e.g., 118) having a pitch not more than 10 micrometers between adjacent interconnects.

Example 2 provides the microelectronic assembly of example 1, in which each scribe region comprises at least one of alignment marks (e.g., 204, FIG. 2A), metal structures (e.g., 228, FIG. 2C) conductively uncoupled from the first circuits, and a region without any metal structures (e.g., 212).

Example 3 provides the microelectronic assembly of any one of examples 1-2, in which the first circuits are each approximately 700 square millimeters in area.

Example 4 provides the microelectronic assembly of any one of examples 1-3, in which: the first circuits are DRAM circuits, and the second circuit is at least one of a PHY circuit (e.g., 116A) or a network circuit (e.g., 116B).

Example 5 provides the microelectronic assembly of any one of examples 1-4, in which (e.g., FIG. 1B) the interconnects comprise metal-metal bonds (e.g., 140) and oxide-oxide bonds (e.g., 142) at an interface (e.g., 138) between the first IC die and the second IC die.

Example 6 provides the microelectronic assembly of any one of examples 1-5, in which the first IC die comprises a stack of the first IC dies coupled by an interconnect layer (e.g., 108) having interconnects at a pitch not more than 10 micrometers between adjacent ones of the interconnects.

Example 7 provides the microelectronic assembly of example 6, further comprising a package substrate (e.g., 132), in which: the stack of the first IC dies is between the plurality of second IC dies and the package substrate, and the stack of the first IC dies is coupled to the package substrate with interconnects (e.g., 134) having a pitch greater than 10 micrometers between adjacent ones of the interconnects.

Example 8 provides the microelectronic assembly of example 7, in which the plurality of second IC dies is conductively coupled to the package substrate by TSVs (e.g., 136) in the stack of the first IC dies.

Example 9 provides the microelectronic assembly of any one of examples 1-8, further comprising a plurality of third IC dies (e.g., 120), in which: subsets of the plurality of third IC dies are coupled to corresponding ones of the second IC dies on a side of the second IC dies opposite to the first IC die, and subsets of the plurality of third IC dies are coupled to corresponding ones of the second IC dies by interconnects (e.g., 124) having a pitch not more than 10 micrometers between adjacent ones of the interconnects.

Example 10 provides the microelectronic assembly of example 9, in which at least some IC dies in the plurality of third IC dies comprise digital logic circuits (e.g., 122).

Example 11 provides the microelectronic assembly of example 9, in which at least some IC dies in the plurality of third IC dies comprise cache-memory circuits.

Example 12 provides the microelectronic assembly of any one of examples 9-11, in which: the second circuit comprises a network circuit (e.g., 116B), and the third IC dies in any subset of the plurality of third IC dies are coupled together by the network circuit in the corresponding one of the second IC dies.

Example 13 provides the microelectronic assembly of any one of examples 9-12, in which the third IC dies are conductively coupled to the first IC die by TSVs (e.g., 136) in the second IC dies.

Example 14 provides the microelectronic assembly of any one of examples 1-13, further comprising a PIC (e.g., 126) coupled to one or more of the second IC dies in the plurality of second IC dies on a side of the second ICs die opposite to the first IC die, in which the PIC is coupled to the second IC dies by interconnects (e.g., 128) having a pitch not more than 10 micrometers between adjacent ones of the interconnects.

Example 15 provides the microelectronic assembly of example 14, in which the PIC is coupled to an optical fiber (e.g., 130).

Example 16 provides the microelectronic assembly of any one of examples 1-15, in which (e.g., FIG. 2C) the first IC die comprises a metallization stack (e.g., 214) comprising: a plurality of layers of one or more ILD materials (e.g., 216); conductive traces (e.g., 218) surrounded by the ILD material; and conductive vias (e.g., 220) in the ILD material conductively coupling the conductive traces in different layers.

Example 17 provides the microelectronic assembly of example 16, in which: a first subset (e.g., 222) of the plurality of layers has conductive traces with a first pitch between adjacent conductive traces, a second subset (e.g., 224, 112) of the plurality of layers has conductive traces with a second pitch between adjacent conductive traces, the second pitch being larger than the first pitch, a third subset (e.g., 108) of the plurality of layers comprises the interconnects between the first IC die and the second IC die, and the conductive pathway is in the second subset.

Example 18 provides the microelectronic assembly of example 17, further comprising MIM capacitors (e.g., 226) in the second subset.

Example 19 provides the microelectronic assembly of any one of examples 17-18, in which the second subset of the plurality of layers is between the third subset of the plurality of layers and the first subset of the plurality of layers.

Example 20 provides the microelectronic assembly of any one of examples 17-19, in which (e.g., FIG. 2A) each conductive pathway comprises a plurality of metal lines (e.g., 202).

Example 21 provides the microelectronic assembly of example 20, in which (e.g., FIG. 2B): the metal lines (e.g., 202) of the conductive pathway comprise a transmission region (e.g., 206), a reception region (e.g., 208) and a stitch region (e.g., 210) between the transmission region and the reception region, and adjacent metal lines of the conductive pathway are separated by metrology regions (e.g., 212) adjacent to the stitch regions, and the metrology regions comprise metal structures (e.g., 208) extending through the first subset and the second subset.

Example 22 provides an IC package, comprising (e.g., FIGS. 3-5): a first IC die (e.g., 102) comprising a plurality of memory circuits (e.g., 104(1), 104(2)) and a plurality of scribe regions (e.g., 106), each scribe region between adjacent ones of the memory circuits; a plurality of second IC dies (e.g., 114(1), 114(2)) coupled to the first IC die, each one of the second IC dies proximate to and conductively coupled to a corresponding one of the memory circuits; and a plurality of third IC dies (e.g., 120(1)), distinct subsets of the plurality of third IC dies being coupled to separate ones of the second IC dies on sides of the second IC dies opposite to the first IC die, in which: each subset of the plurality of third IC dies is conductively coupled together by a network circuit (e.g., 116B(1)) in the second IC die to which the subset is coupled, and adjacent ones of the memory circuits are conductively coupled by conductive pathways (e.g., 110) through the scribe regions.

Example 23 provides the IC package of example 22, further comprising at least one PIC (e.g., 126) coupled to at least one of the second IC dies, in which the at least one PIC is configured to couple to an optical fiber for enabling communication between the IC package and another IC package.

Example 24 provides the IC package of example 23, in which the plurality of second IC dies is conductively coupled to the at least one PIC.

Example 25 provides the IC package of any one of examples 22-24, in which the first IC die is larger than 1 square inch.

Example 26 provides the IC package of any one of examples 22-25, in which the first IC die comprises a single monolithic wafer (e.g., FIG. 5).

Example 27 provides the IC package of any one of examples 22-25, in which the first IC die comprises a plurality of stacked monolithic wafers (e.g., FIG. 5) coupled by interconnects having a pitch not more than 10 micrometers between adjacent ones of the interconnects.

Example 28 provides the IC package of example 27, in which each monolithic wafer comprises a plurality of memory circuits and a plurality of scribe regions, the scribe region being between adjacent ones of the memory circuits.

Example 29 provides the IC package of any one of examples 22-28, further comprising a package substrate (e.g., 132) (e.g., FIGS. 3, 4).

Example 30 provides the IC package of example 29, in which the first IC die is coupled to the package substrate on a side of the first IC die opposite to the plurality of second IC dies.

Example 31 provides a microelectronic system (e.g., 600), comprising: a plurality of microelectronic assemblies (e.g., 100) coupled together by optical fibers, each microelectronic assembly comprising: a panel (e.g., 100) comprising a plurality of integrated circuits (e.g., 104); a plurality of IC dies coupled to a surface of the panel by first interconnects; and a plurality of PICs coupled to the plurality of IC dies by second interconnects, in which: the panel is larger than 700 square millimeter in area, the integrated circuits in each panel are separated from each other by scribe regions between adjacent ones of the integrated circuits, the integrated circuits are conductively coupled to adjacent integrated circuits by conductive pathways in the scribe regions, and the IC dies are conductively coupled to respective ones of the integrated circuits by conductive pathways through the first interconnects.

Example 32 provides the microelectronic system of example 31, in which: the panel comprises a stack of monolithic semiconductor wafers coupled together by third interconnects having a pitch not more than 10 micrometers between adjacent ones of the interconnects, and each wafer comprises integrated circuits coupled by conductive pathways in scribe regions between adjacent ones of the integrated circuits.

Example 33 provides the microelectronic system of example 32, in which the third interconnects comprise metal-metal bonds and oxide-oxide bonds.

Example 34 provides the microelectronic system of any one of examples 31-33, in which: adjacent ones of the first interconnects are spaced apart by a first pitch, adjacent ones of the second interconnects are spaced apart by a second pitch, and the first pitch is smaller than the second pitch.

Example 35 provides the microelectronic system of example 31, in which: the panel is coupled to another panel by one or more fiber optic cables, and the fiber optic cables are coupled to the plurality of PICs.

Example 36 provides a method, comprising: providing a first IC die including a first circuit, a second circuit and a scribe region between the first circuit and the second circuit; providing a second IC die comprising a third circuit different from the first circuit or the second circuit; and coupling the second IC die to the first IC die proximate to the first circuit and distant from the second circuit by interconnects having a pitch not more than 10 micrometers between adjacent interconnects, in which: at least one of the first circuit and the second circuit is approximately 700 square millimeters in area, and the first circuit and the second circuit are coupled by a conductive pathway through the scribe region.

Example 37 provides the method of example 36, further comprising coupling a PIC to the second IC die.

Example 38 provides the method of example 37, further comprising coupling the PIC to an optical fiber.

Example 39 provides the method of any one of examples 36-38, further comprising coupling a plurality of third IC dies to the second IC die opposite to the first IC die, in which the third IC dies comprise separate fourth circuits different from the first circuit, the second circuit, or the third circuit.

Example 40 provides the method of example 39, further comprising coupling the separate fourth circuits in the plurality of third IC dies by the third circuit in the second IC die.

Example 41 provides a microelectronic assembly (e.g., 100, FIG. 1A), comprising: a first IC die (e.g., 102) including a plurality of first circuits (e.g., 104) separated by scribe regions (e.g., 106) between adjacent ones of the first circuits, the adjacent ones of the first circuits being coupled by conductive pathways in the scribe regions; a second IC die (e.g., 114) coupled to the first IC die, the second IC die comprising a second circuit (e.g., 116) different from the first circuits; and a PIC (e.g., 126) coupled to the second IC die on a side opposite to the first IC die.

Example 42 provides the microelectronic assembly of example 41, in which the first circuits comprise DRAM circuits and the second circuit comprises at least one of a PHY circuit and a network circuit.

Example 43 provides the microelectronic assembly of any one of examples 41-42, in which the first IC die comprises a wafer of monolithic semiconductor larger than 700 mm$^2$ in area.

Example 44 provides the microelectronic assembly of example 43, in which: the PIC is coupled to a first end of an optical fiber, and a second end of the optical fiber is coupled to another PIC attached to another microelectronic assembly.

Example 45 provides the microelectronic assembly of any one of examples 41-44, in which several ones of the microelectronic assembly are communicatively coupled together by optical fibers coupled to respective PICs.

Example 46 provides the microelectronic assembly of example 45, in which the microelectronic assemblies are rack-mount blades of at least one of a network server, a network switch and a network router.

Example 47 provides the microelectronic assembly of any one of examples 41-46, further comprising a plurality of third IC dies coupled to the second IC die on a side of the second IC die opposite to the first IC die.

Example 48 provides the microelectronic assembly of example 47, in which: the second circuit comprises a network circuit, and the third IC dies are coupled together by the network circuit.

Example 49 provides the microelectronic assembly of any one of examples 47-48, in which a subset of the third IC dies comprises digital logic circuits and another subset of the third IC dies comprises cache-memory circuits.

Example 50 provides the microelectronic assembly of any one of examples 48-49, in which the PIC is coupled to the second circuit.

Example 51 provides the microelectronic assembly of any one of examples 47-50, in which the third IC dies are coupled to the first circuits through TSVs in the second circuit.

Example 52 provides the microelectronic assembly of any one of examples 41-51, in which the PIC extends beyond an edge of the second IC die, exposing an overhanging surface on a side of the PIC proximate to the second IC die.

Example 53 provides the microelectronic assembly of example 52, in which the overhanging surface of the PIC comprises optical structures.

Example 54 provides the microelectronic assembly of example 53, in which the optical structures are coupled to the second circuit in the second IC die.

Example 55 provides the microelectronic assembly of example 54, in which: the PIC comprises a multi-wavelength laser and ring modulators coupled between the optical structures and the second circuit, and the ring modulators and the multi-wavelength laser are configured to convert electrical signals from the second circuit to optical signals.

Example 56 provides the microelectronic assembly of any one of example 54-55, in which the second circuit comprises drivers, amplifiers and serial/deserializer circuits.

Example 57 provides the microelectronic assembly of any one of examples 54-56, in which: the PIC comprises photodetectors coupled between the optical structures and the second circuit, and the photodetectors are configured to convert optical signals to electrical signals.

Example 58 provides the microelectronic assembly of any one of examples 52-57, in which a surface of the PIC proximate and perpendicular to the overhanging surface is coupled to an optical fiber.

Example 59 provides the microelectronic assembly of any one of examples 41-58, in which the PIC is coupled to the second IC die by interconnects having a pitch not more than 10 micrometers between adjacent ones of the interconnects.

Example 60 provides the microelectronic assembly of any one of examples 41-59, in which the PIC is conductively coupled to the first IC die by TSVs in the second IC die.

Example 61 provides an IC package, comprising (e.g., FIGS. 3-5): a first IC die (e.g., 102) comprising a plurality of memory circuits (e.g., 104(1), 104(2)) and a plurality of scribe regions (e.g., 106), in which each scribe region is between adjacent ones of the memory circuits and adjacent memory circuits are coupled by conductive pathways in the scribe region; a plurality of second IC dies (e.g., 114(1), 114(2)) coupled to the first IC die, each one of the second IC dies proximate to and conductively coupled to a corresponding one of the memory circuits; and a plurality of PICs (e.g., 126) coupled to the plurality of second IC dies on a side of the second IC dies opposite to the first IC die, in which a portion of a surface of each PIC overhangs an edge of the second IC die to which the PIC is coupled, exposing waveguides on the surface.

Example 62 provides the IC package of example 61, further comprising a plurality of third IC dies (e.g., 120(1)), in which: distinct subsets of the plurality of third IC dies are coupled to separate ones of the second IC dies opposite to the first IC die, each subset of the plurality of third IC dies is conductively coupled together by a network circuit (e.g., 116B(1)) in the second IC die to which the subset is coupled, and adjacent ones of the memory circuits are conductively coupled by conductive pathways (e.g., 110) through the scribe regions.

Example 63 provides the IC package of any one of examples 61-62, in which the waveguides are configured to be coupled to one or more optical fibers.

Example 64 provides the IC package of any one of examples 61-63, in which each PIC comprises: ring modulators configured to convert electrical signals from the second IC die to optical signals through the waveguides; and photodetectors configured to convert optical signals through the waveguides to electrical signals for the second IC die.

Example 65 provides the IC package of any one of examples 61-64, in which: the first IC die comprises a stack of monolithic semiconductor wafers stacked together by interconnects having a pitch not more than 10 micrometers between adjacent ones of the interconnects, and each one of the wafers comprises the plurality of memory circuits, the plurality of scribe regions and conductive pathways through the scribe regions.

Example 66 provides the IC package of any one of examples 61-64, in which: the first IC die comprises a stack of semiconductor panels stacked together by interconnects having a pitch not more than 10 micrometers between adjacent ones of the interconnects, and each one of the panels comprises the plurality of memory circuits, the plurality of scribe regions and conductive pathways through the scribe regions.

Example 67 provides the IC package of any one of examples 61-66, further comprising a package substrate coupled to the first IC die on a side of the first IC die opposite to the second IC die.

Example 68 provides the IC package of example 67, in which the PICs are conductively coupled to the package substrate by TSVs in the second IC die and the first IC die.

Example 69 provides the IC package of any one of examples 67-68, in which: the first IC die is coupled to the second IC die by interconnects having a pitch not more than 10 micrometers between adjacent interconnects, and the first IC die is coupled to the package substrate by interconnects having a pitch more than 10 micrometers between adjacent interconnects.

Example 70 provides the IC package of any one of examples 61-69, in which the memory circuits are each larger than 700 square millimeters in area.

Example 71 provides a method, comprising: coupling a first IC die to a second IC die by interconnects having a pitch not more than 10 micrometers between adjacent interconnects; coupling a PIC to the second IC die; and coupling a optical fiber to the PIC, in which: the first IC die includes a first circuit, a second circuit and a scribe region between the first circuit and the second circuit, the first circuit and the second circuit are conductively coupled by a conductive pathway in the scribe region, the second circuit includes a third circuit different from the first circuit or the second circuit, and the second IC die is coupled to the first IC die proximate to the first circuit and distant from the second circuit.

Example 72 provides the method of example 71, in which coupling the PIC to the second IC die includes: providing a portion of the PIC beyond an edge of the second IC die; and exposing waveguides on a surface of the PIC in the portion, in which the optical fiber is coupled to the exposed waveguides.

Example 73 provides the method of any one of examples 71-72, in which the first circuit and the second circuit are DRAM circuits, and the second circuit is at least one of a PHY circuit and a network circuit.

Example 74 provides the method of any one of examples 71-73, in which the PIC is coupled to the second circuit.

Example 75 provides the method of example any one of examples 71-74, further comprising coupling a plurality of third IC dies to the second IC die on a side of the second IC die opposite to the first IC die.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
    a first integrated circuit (IC) die including a plurality of first circuits separated by scribe regions between adjacent ones of the plurality of first circuits; and
    a plurality of second IC dies coupled to the first IC die, each one of the plurality of second IC dies being coupled proximate and adjacent to a corresponding one of the plurality of first circuits and conductively coupled to the corresponding one of the plurality of first circuits,
    wherein:
        one or more of the plurality of second IC dies comprises a second circuit different from the plurality of first circuits,
        adjacent ones of the plurality of first circuits are coupled by a conductive pathway through the scribe regions, and
        the first IC die and the plurality of second IC die are coupled by interconnects having a pitch not more than 10 micrometers between adjacent interconnects.

2. The microelectronic assembly of claim 1, wherein each of the scribe regions comprises at least one of alignment marks, metal structures conductively uncoupled from the plurality of first circuits, and a region without the metal structures.

3. The microelectronic assembly of claim 1, wherein:
    the plurality of first circuits are dynamic random-access memory (DRAM) circuits, and
    the second circuit is at least one of a physical layer interface (PHY) circuit or a network circuit.

4. The microelectronic assembly of claim 1, wherein the first IC die comprises a stack of first IC dies coupled by an interconnect layer having interconnects at a pitch not more than 10 micrometers between adjacent ones of the interconnects.

5. The microelectronic assembly of claim 1, further comprising a plurality of third IC dies, wherein:
    subsets of the plurality of third IC dies are coupled to corresponding ones of the plurality of second IC dies on a side of the plurality of second IC dies opposite to the first IC die, and
    subsets of the plurality of third IC dies are coupled to corresponding ones of the plurality of second IC dies by interconnects having a pitch not more than 10 micrometers between adjacent ones of the interconnects.

6. The microelectronic assembly of claim 5, wherein at least one IC die in the plurality of third IC dies comprises a digital logic circuits.

7. The microelectronic assembly of claim 5, wherein at least one IC die in the plurality of third IC dies comprises a cache-memory circuits.

8. The microelectronic assembly of claim 1, further comprising a photonics IC die (PIC) coupled to one or more of the plurality of second IC dies in the plurality of second IC dies on a side of the plurality of second IC dies opposite to the first IC die, wherein the PIC is coupled to the plurality of second IC dies by interconnects having a pitch not more than 10 micrometers between adjacent ones of the interconnects.

9. An IC package, comprising:
    a first IC die comprising a plurality of memory circuits and a plurality of scribe regions, each of the plurality of scribe regions between adjacent ones of the plurality of memory circuits;
    a plurality of second IC dies coupled to the first IC die, each one of plurality of the second IC dies proximate to and conductively coupled to a corresponding one of the plurality of memory circuits; and
    a plurality of third IC dies, distinct subsets of the plurality of third IC dies being coupled to separate ones of the plurality of second IC dies on sides of the plurality of second IC dies opposite to the first IC die, wherein:

each subset of the plurality of third IC dies is conductively coupled together by a network circuit in the plurality of second IC die to which the subset is coupled, and adjacent ones of the plurality of memory circuits are conductively coupled by conductive pathways through the plurality of scribe regions.

10. The IC package of claim 9, further comprising at least one PIC coupled to at least one of the plurality of second IC dies, wherein the at least one PIC is configured to couple to an optical fiber for enabling communication between the IC package and another IC package.

11. The IC package of claim 10, wherein the plurality of second IC dies is conductively coupled to the at least one PIC.

12. The IC package of claim 9, wherein the first IC die comprises a plurality of stacked monolithic wafers coupled by interconnects having a pitch not more than 10 micrometers between adjacent ones of the interconnects.

13. The IC package of claim 12, wherein each of plurality of stacked monolithic wafers comprises a plurality of memory circuits and a plurality of scribe regions, the plurality of scribe regions being between adjacent ones of the plurality of memory circuits.

14. The IC package of claim 9, further comprising a package substrate.

15. The IC package of claim 14, wherein the first IC die is coupled to the package substrate on a side of the first IC die opposite to the plurality of second IC dies.

16. A method, comprising:

providing a first IC die including a first circuit, a second circuit and a scribe region between the first circuit and the second circuit;

providing a second IC die comprising a third circuit different from the first circuit or the second circuit; and coupling the second IC die to the first IC die proximate to the first circuit and distant from the second circuit by interconnects having a pitch not more than 10 micrometers between adjacent interconnects, wherein:

at least one of the first circuit and the second circuit is approximately 700 square millimeters in area, and the first circuit and the second circuit are coupled by a conductive pathway through the scribe region.

17. The method of claim 16, further comprising coupling a PIC to the second IC die.

18. The method of claim 17, further comprising coupling the PIC to an optical fiber.

19. The method of claim 16, further comprising coupling a plurality of third IC dies to the second IC die opposite to the first IC die, wherein the plurality of third IC dies comprises separate fourth circuits different from the first circuit, the second circuit, or the third circuit.

20. The method of claim 19, further comprising coupling the separate fourth circuits in the plurality of third IC dies by the third circuit in the second IC die.

* * * * *